(12) United States Patent
Kawamoto et al.

(10) Patent No.: US 7,787,528 B2
(45) Date of Patent: Aug. 31, 2010

(54) TRANSMITTING/RECEIVING DEVICE AND COMMUNICATION SYSTEM USING THE SAME

(75) Inventors: Takashi Kawamoto, Kokubunji (JP); Tomoaki Takahashi, Hachioji (JP); Shinya Kikuchi, Takasaki (JP); Yoshimi Ishida, Kodaira (JP); Hiromitsu Nishio, Funabashi (JP)

(73) Assignee: Renesas Technology Corp., Tokyo (JP)

( * ) Notice: Subject to any disclaimer, the term of this patent is extended or adjusted under 35 U.S.C. 154(b) by 845 days.

(21) Appl. No.: 11/548,991

(22) Filed: Oct. 12, 2006

(65) Prior Publication Data
US 2007/0153129 A1    Jul. 5, 2007

(30) Foreign Application Priority Data

Oct. 14, 2005    (JP) .............................. 2005-299863
Aug. 4, 2006    (JP) .............................. 2006-213219

(51) Int. Cl.
*H04B 1/38*    (2006.01)
*H04L 5/16*    (2006.01)
*G05D 1/00*    (2006.01)

(52) U.S. Cl. ................... 375/219; 375/220; 375/221; 375/222; 375/329; 375/332; 455/73; 701/1

(58) Field of Classification Search ......... 375/219–222, 375/329, 332; 455/73; 701/1
See application file for complete search history.

(56) References Cited

U.S. PATENT DOCUMENTS

| | | | | |
|---|---|---|---|---|
| 5,291,515 A | * | 3/1994 | Uchida et al. ................ | 375/142 |
| 5,939,948 A | | 8/1999 | Nakazawa | |
| 5,940,744 A | | 8/1999 | Uda | |
| 6,040,738 A | * | 3/2000 | Uchida ........................ | 329/302 |
| 6,198,355 B1 | * | 3/2001 | Lindquist et al. ............... | 331/27 |
| 6,790,116 B2 | * | 9/2004 | Inahashi ...................... | 455/118 |
| 6,956,419 B1 | * | 10/2005 | Mann et al. .................. | 327/162 |
| 7,133,647 B2 | * | 11/2006 | Dent ............................ | 455/75 |
| 7,558,357 B1 | * | 7/2009 | Greshishchev et al. ....... | 375/371 |

(Continued)

FOREIGN PATENT DOCUMENTS

CN    1177789 A    4/1998

(Continued)

OTHER PUBLICATIONS

Baker et al., "CMOS Circuit Design, Layout, and Simulation," p. 480, IEEE Press.

*Primary Examiner*—David C Payne
*Assistant Examiner*—Erin M File
(74) *Attorney, Agent, or Firm*—Miles & Stockbridge P.C.

(57) ABSTRACT

Disclosed is a semiconductor IC device using a low-price oscillator, which is capable of bidirectional communication with a host and features a low price. In bidirectional communication between a host and a device, the device comprises a synchronization establishment unit, a frequency difference detector, a frequency generator, and an oscillator providing a reference signal. The synchronization establishment unit to which an output signal from the host is inputted outputs a received signal, a synchronization establishment signal and a reception data. The frequency difference detector detects a frequency difference between a received signal and a transmitting signal, and outputs a frequency coordination signal to the frequency generator. The number of frequency division of the frequency generator is controlled by the frequency coordination signal, and the frequency generator is capable of matching the frequency of the transmitting signal which is an output signal with the frequency of the received signal.

8 Claims, 35 Drawing Sheets

U.S. PATENT DOCUMENTS

| | | | |
|---|---|---|---|
| 2002/0031032 A1* | 3/2002 | Ooishi | 365/226 |
| 2002/0051510 A1* | 5/2002 | Noguchi | 375/376 |
| 2004/0058653 A1* | 3/2004 | Dent | 455/69 |
| 2006/0014510 A1* | 1/2006 | Yamamoto et al. | 455/260 |
| 2006/0045053 A1* | 3/2006 | Erlich et al. | 370/338 |
| 2006/0114074 A1* | 6/2006 | Matsui et al. | 331/177 V |
| 2006/0227916 A1* | 10/2006 | Masui et al. | 375/355 |
| 2007/0090883 A1* | 4/2007 | Yang et al. | 331/16 |
| 2007/0177703 A1* | 8/2007 | Senba | 375/376 |
| 2008/0095249 A1* | 4/2008 | Yoon et al. | 375/260 |

FOREIGN PATENT DOCUMENTS

| | | |
|---|---|---|
| CN | 1200602 A | 12/1998 |
| JP | 08-335932 A | 12/1996 |
| JP | 09-270779 A | 10/1997 |
| JP | 11-284638 A | 10/1999 |
| JP | 2001-230750 A | 8/2001 |
| JP | 2001-244919 A | 9/2001 |

* cited by examiner

| |T-R|<br>=ErN | FCS |
|---|---|
| A | Na |
| B | Nb |
| C | Nc |
| ... | ... |
| Y | Ny |

500

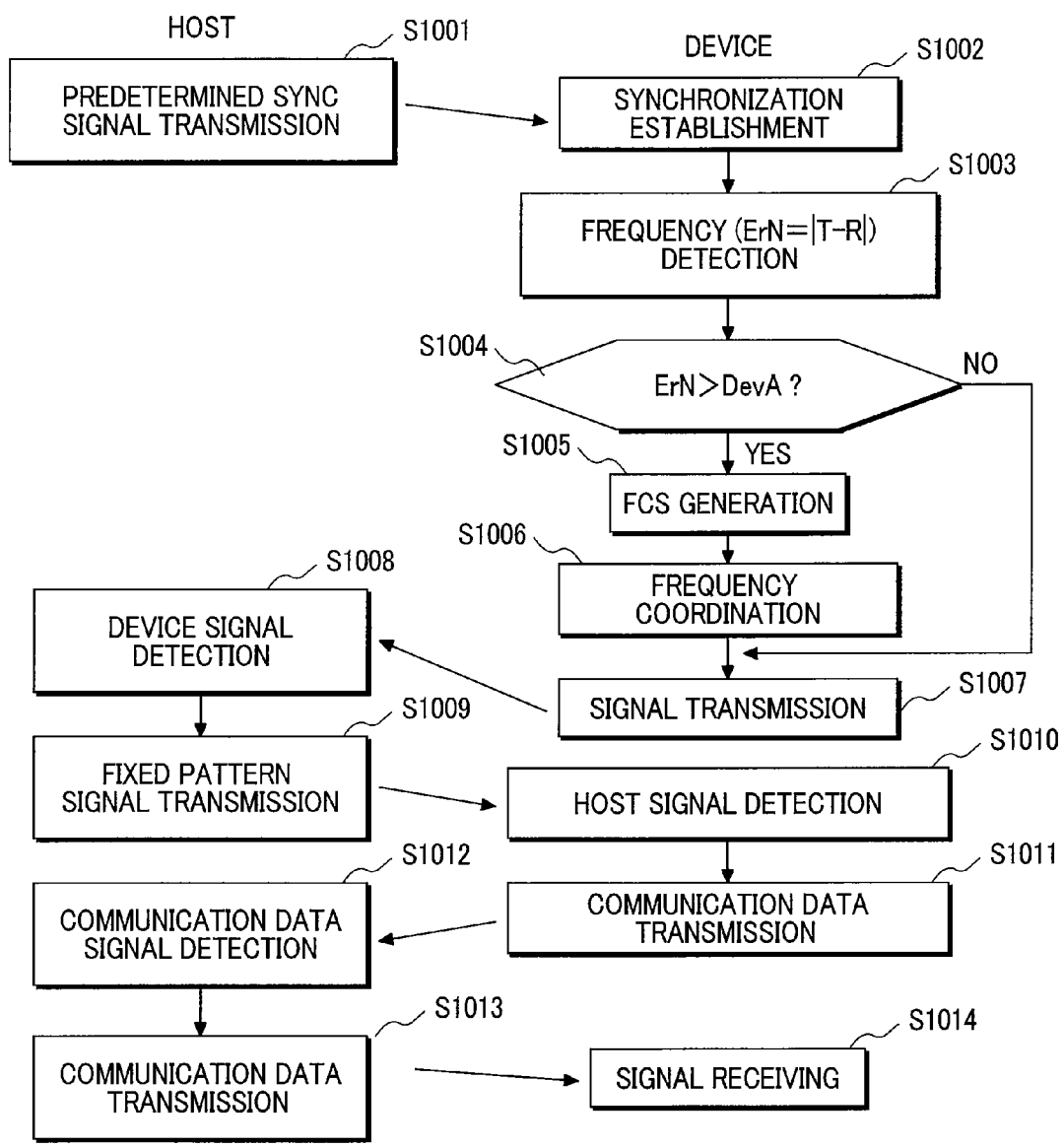

TRANSMITTING/RECEIVING DEVICE AND COMMUNICATION SYSTEM USING THE SAME

CROSS-REFERENCE TO RELATED APPLICATIONS

The present application claims priority from Japanese application JP 2005-299863 filed on Oct. 14, 2005, and Japanese application JP 2006-213219 filed on Aug. 4, 2006, the contents of which are hereby incorporated by reference into this application.

FIELD OF THE INVENTION

The present invention relates to a transmitting/receiving device and a communication system using the same, and more particularly to a transmitting/receiving device with an automatic coordination function of transmitting signals incorporated in a semiconductor IC device, a recording/reproducing device for example, using a standard I/O device performing a bidirectional between a host and a device or a recording medium inclusive of HDD/CD/DVD/BD (Blue-ray Disc) and so forth, and a communication system using the same.

BACKGROUND OF THE INVENTION

In general, a device, e.g., a semiconductor IC device, capable of bidirectional communication with a host uses a signal frequency with standardized level for the bidirectional communication. Therefore, if the signal is not of the standard frequency, the communication cannot be established. Because of this, a technique for adjusting a signal frequency within a given standard frequency range has been available.

For example, Japanese Patent Laid-Open No. 2001-230750 discloses a frequency synchronization method, in which the frequency of the fundamental clock of an upstream transmitter and the frequency of the local clock of a downstream receiver are synchronized by controlling the frequency of the fundamental clock of the transmitter based on the frequency coordination information outputted from the receiver.

Japanese Patent Laid-Open No. 2001-244919 discloses a data transmitter transmitting/receiving data through an interface, in which a primary side data transmitter and a secondary side data transmitter have their own clock source and the secondary side reads out an amount of accumulated transmitting data to control a VCO frequency, thereby the clock of the secondary side is matched with the primary side clock.

Japanese Patent Laid-Open No. H11-284638 discloses a communication system to transmit and receive data without failure even if a local device system clock is not synchronized with an opposite-side system clock. To this end, an opposite-system clock included in a signal the local device system received is separated from data, the reception data is read out by a local device system clock, and the opposite-side system clock is used for a synchronizing signal for transmitting the transmission data.

Japanese Patent Laid-Open No. H09-270779 discloses a data synchronization system capable of synchronizing operation clocks between devices on transmission and reception sides without transmitting data synchronization clocks between the transmission side device and the reception side device. To this end, the reception side device controls the frequency of the operation clocks based on its own data residual amount.

Japanese Patent Laid-Open No. H08-335932 discloses a clock synchronization technique for synchronizing a transmission clock with a reception clock by controlling an oscillator with phase comparison information of a digital PLL circuit generating the reception clock, by controlling a frequency division ratio from received data.

A reference voltage generation circuit is disclosed in the document "CMOS Circuit Design, Layout, and Simulation", by R. J. Baker, et al., (IEEE Press, p 480).

SUMMARY OF THE INVENTION

Adaptability is an essential factor in the development of a device, such as, a semiconductor IC device using a recording medium HDD/CD/DV/BD (Blu-ray Disc) and the like, so the device should be connectable to various hosts.

It is another essential factor to set the market price of such semiconductor IC device low. Therefore, an expensive price of a crystal oscillator (TCXO) used as an externally mounted component is a great burden to many manufacturers. Especially, because a lot of semiconductor IC devices require highly accurate reference signals to meet enormous demands for high-speed communication or to resolve deterioration in device noises due to delicate operations in semiconductor fabrication, etc., even more expensive crystal oscillators are now employed.

FIG. 24 illustrates a semiconductor IC device generating a very accurate reference signal by employing a high price crystal oscillator. In bidirectional communication between a host 2 and a device 1, the device 1 includes a synchronizer 17, a frequency generator 18, and a digital signal generator 19.

The frequency Ftx of a transmitting signal TX from the device 1 is controlled by the frequency generator 18 as follows.

$$Ftx = Fref \times N$$

In which Fref denotes a reference signal provided by an externally mounted oscillator 3, and N is the number of frequency division by the frequency generator 18.

Here, when an allowable frequency deviation DevA to the transmitting signal TX and a frequency deviation DevB caused by manufacturing deviation of the externally mounted oscillator 3, temperature change, change in elapsed time and so forth are in relation of DevA<DevB, the device 1 cannot generate the transmitting signal TX falling within its allowable frequency deviation DevA. As a result, communication between the host 2 and the device 1 is not established.

Because of this, the externally mounted oscillator in the conventional technology had to satisfy the condition DevA>DevB, although it required manufacturers to use an expensive crystal oscillator all the time.

However, this was an obstacle to introduce low-price semiconductor IC devices to the market.

Even though many attempts have been made to realize a semiconductor IC device using an inexpensive oscillator, since the frequency deviation of the inexpensive oscillator greatly increases by manufacturing deviation, temperature change, change in elapsed time and so forth, it was practically useless to adapt such semiconductor IC devices for communication with hosts.

This type of problem was also observed in the devices of the related arts described above, wherein each device has a synchronization function with a host.

As mentioned before, it is required that a semiconductor IC device should have adaptability, being connectable to various hosts. Unfortunately however, if a device is adaptable to various hosts, it is impossible to synchronize the fundamental clock of an upstream host with the frequency of the local clock of a downstream device as in Japanese Patent Laid-Open No. 2001-230750. In effect, the synchronization is possible only if the host and each device is in a one closed system. Supposedly, even though an inexpensive oscillator could be used for the device of such system, the frequency deviation of the host will be increased, making it very difficult to be used for a high-speed transmission system requiring a very accurate reference signal.

Moreover, in the case that a device of an open loop system without a synchronization establishment detecting function with a host, as disclosed in Japanese Patent Laid-Open Nos. 2001-244919, H09-270779, and H08-335932, uses an inexpensive oscillator, the device is not able to generate a transmitting signal of which frequency falling within an allowable frequency deviation DevA set for a host equipped with a high accuracy oscillator. Consequently, such device is not adequate for high-speed transmission.

In addition, as disclosed in Japanese Patent Laid-Open No. H11-284638, in the case of a communication system which transmits a signal synchronously with an opposite-side system clock included in a transmitting signal, the clock is subjected to the influence of noises when the opposite-side system clock is separated from the signal, so this makes the system inadequate for high-speed transmission having a strict noise specification. Besides, if a device is constituted by an inexpensive oscillator, it becomes difficult to read out the reception data accompanied with an increased frequency deviation.

Therefore, it is an object of the present invention to provide a low-price semiconductor IC device excellent in adaptability and capable of bidirectional communication with a host by using an inexpensive oscillator.

It is another object of the present invention to provide a low price semiconductor IC device excellent in adaptability and capable of bidirectional communication facilitating the accommodation to high-speed transmission with a strict noise specification.

Summary of the typical inventions among those disclosed in the present application will be explained briefly as follows.

To achieve the above objects and advantages, there is provided a transmitting/receiving device with a data transmitting and receiving function enabling bidirectional communication with a host, wherein the transmitting/receiving device includes a synchronization control unit, a frequency generator generating a transmitting signal, and a reference signal generating source generating a reference signal.

The synchronization control unit detects a frequency difference of the transmitting signal with respect to a received signal from the host and outputs a frequency adjustment signal for reducing the error with respect to the received signal.

The frequency generator determines frequency of the transmitting signal based on the reference signal and adjusts the frequency of the transmitting signal by the frequency adjusting signal.

According to the present invention, it is possible to provide a semiconductor IC device excellent in adaptability using an inexpensive oscillator as the reference signal generating source.

BRIEF DESCRIPTION OF THE DRAWINGS

The above aspects and features of the present invention will be more apparent by describing certain embodiments of the present invention with reference to the accompanying drawings, in which:

FIG. 10 is a sequence at the time of recovery from power-on and power save modes of the transmitting/receiving device with an automatic coordination function of transmission signals according to Embodiment 1 of the present invention shown in FIG. 1;

DETAILED DESCRIPTION OF THE PREFERRED EMBODIMENTS

Basically, the transmitting/receiving device of the present invention is a transmitting/receiving device for performing a serial ATA-based communication with a host, and as a reference signal generation source of the communication, an oscillator having a frequency deviation greater than a frequency deviation allowed by the serial ATA is connectably configured.

As an oscillator having a frequency deviation greater than a frequency deviation allowed by the serial ATA, there is a ceramic oscillator, for example. Particularly, when the transmitting/receiving device of the present invention has a ceramic oscillator connectably configured, a serial ATA communication with a further reduced cost can be realized.

Furthermore, the transmitting/receiving device of the present invention can advantageously be used in for the semiconductor IC device formed on a single semiconductor substrate as one unit. In such case, it utilizes a connection terminal for electrically connecting the ceramic oscillator to the semiconductor IC device as an externally mounted component.

A preferred embodiment of the present invention will be described herein below with reference to the accompanying drawings.

Embodiment 1

Embodiment 1 of the present invention will now be explained first with reference to FIGS. 1-12.

Figure 1:
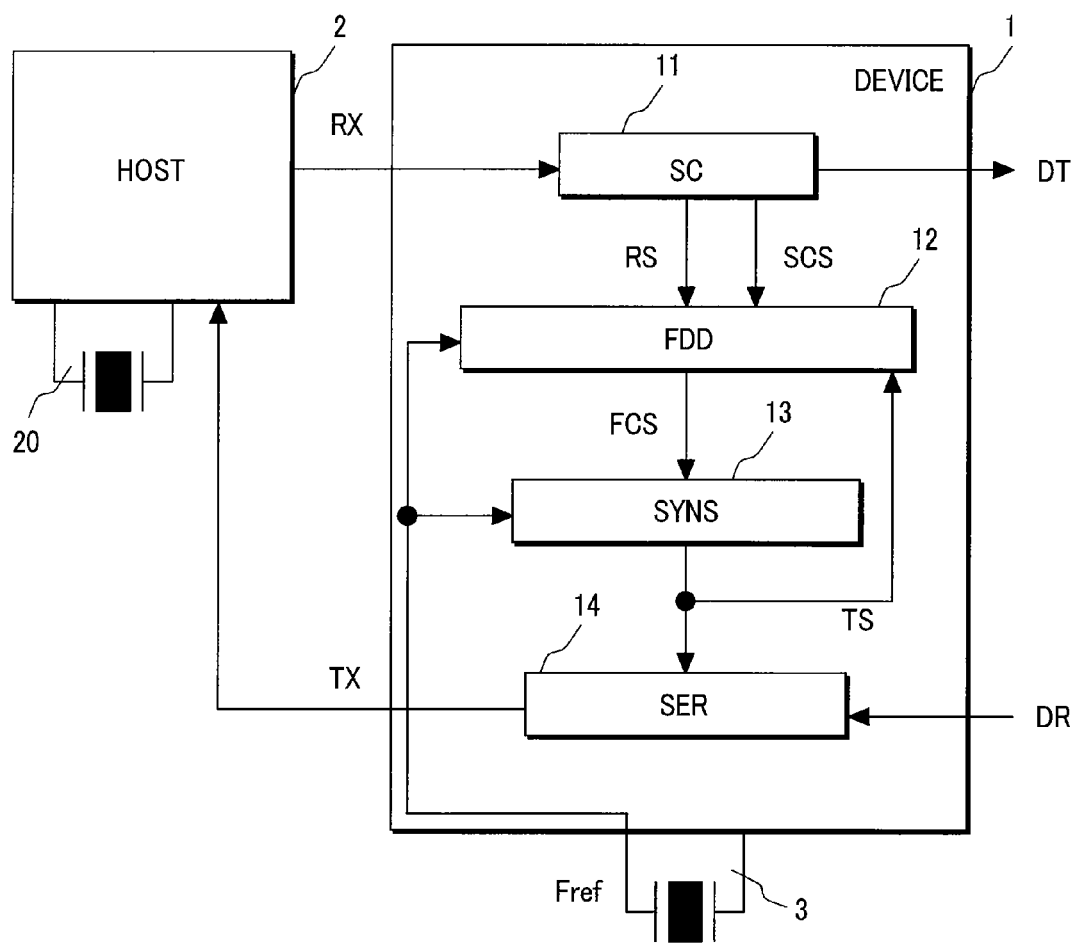
FIG. 1 is a block diagram for explaining an overall configuration of a transmitting/receiving device with an automatic coordination function of transmission signals according to Embodiment 1 of the present invention.

FIG. 1 is a block diagram for explaining an overall configuration of a communication system with an automatic coordination function of transmission signals.

The communication system according to this embodiment is configured to carry out bidirectional communication a device 1 provided with a transmitting/receiving device having a transmitting/receiving function and a host 2 provided with a transmitting/receiving device having a transmitting/receiving function through automatic coordination of transmission signals from each other. That is, the communication system includes the host 2 which outputs RX to the device 1 and receives TX from the device 1, the device 1 which receives RX from the host 2 and outputs a reception data DT and which receives a transmission data DR and transmits TX to the host 2, and a reference signal generating source 3 inputting a reference signal Fref to the device 1. In this embodiment, an oscillator such as a ceramic resonator is utilized as the reference signal generating source 3.

In addition, a transmitting/receiving device (not shown) of the host 2 is configured to operate based on a high accuracy reference signal that is generated by a reference signal generating source 20 formed of a crystal oscillator for example.

The device 1 is a semiconductor IC device using a recording medium, for example, HDD, and as a transmitting/receiving device, includes a synchronization control unit having a synchronization establishment unit 11, a frequency difference detector 12, and a frequency generator 13, and a serializer SER 14.

The synchronization establishment unit (SC) 11 is inputted the RX the device 1 received, and extracts a clock and data from the RX to generate a received signal RS and a synchronization establishment signal SCS, respectively. Also, the unit (SC) 11 outputs the reception data DT. The frequency difference detector FDD 12 is inputted the received signal RS, the synchronization establishment signal SCS, the reference signal Fref, and the transmitting signal TS, and outputs a frequency coordination signal FCS by detecting a frequency difference between the received signal RS and the transmitting signal TS. The frequency generator SYNS 13 is inputted the frequency coordination signal FCS and the reference signal Fref, and outputs the transmitting signal TS of which frequency is determined based on the frequency coordination signal FCS and the reference signal Fref. The serializer SER 14 is inputted the transmitting signal TS and the transmission data DR, and outputs the TX.

As one example of the frequency adjustment operation, suppose for example that the frequency of RX outputted from the host 2 is 1.2 GHz, the frequency of a reference signal outputted from the oscillator 3 is 20 MHz, and the number of frequency division N of the frequency generator 13 is 50 (N=50).

By the synchronization establishment signal SCS which is the data extracted from the RX signal, it is judged whether the RX signal sequence requires the accuracy of the TX signal. If it is judged by the synchronization establishment signal SCS that the sequence requires the accuracy of the TX signal, the device 1 synchronizes the frequency of the RX signal with that of the TX signal following the procedure described below.

At this time, the received signal RS is a clock signal extracted from the RX by the synchronization establishment unit 11, the frequency of the received signal RS is 1.2 GHz the same as the frequency of the RX.

Meanwhile, since the frequency of the transmitting signal TS is generated by the frequency generator 13 which is a phase-locked loop (PLL), Fref×N=20 MHz×50=1.0 GHz is true.

At this time, in the frequency difference detector 12, a frequency difference ErN between the received signal RX and the transmitting signal TS is 1.2 GHz−1.0 GHz=200 MHz.

Given that the frequency of the transmitting signal TS is 1.2 GHz, a frequency coordination signal FCS (FCS=10) is outputted in order to resolve the frequency difference ErN.

Here, in the frequency generator 13, the number of frequency division becomes N=50+FCS=50+10=60, and the frequency of the transmitting signal TS after changing the number of frequency division N becomes Fref×N=20 MHz×60=1.2 GHz.

By this operation, the frequency difference between the received signal RS and the transmitting signal TS becomes 0, and the frequency difference between the RX and the TX also becomes 0.

Figure 2:
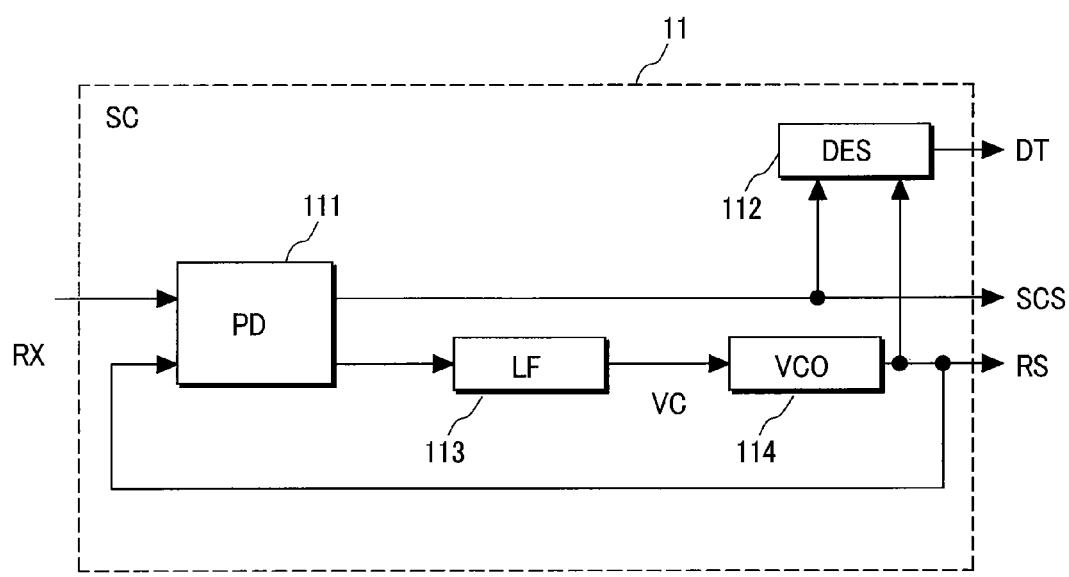
FIG. 2 is a block diagram for explaining an example of a configuration of a synchronization establishment unit in the transmitting/receiving device with an automatic coordination function of transmission signals in FIG. 1.

FIG. 2 illustrates an example of a configuration of the synchronization establishment unit 11 in the device according to Embodiment 1. The synchronization establishment unit 11 includes a phase comparator 111, a loop filter 113, a voltage controlled oscillator (VCO) 114, and a deserializer 112. The phase comparator 111 is inputted the RX and the received signal RS, compares the phase of the RX and the phase of the RS, outputs a comparison result to the loop filter 113, and outputs the synchronization establishment signal SCS. The loop filter 113 makes the comparison signal into a DC signal and outputs it to the VCO 114 as a control voltage VC. The VCO 114 outputs an output signal having the frequency according to the control voltage as a received signal RS. The deserializer 112 is inputted the synchronization establishment signal SCS and the received signal RS, extracts data of the synchronization establishment signal SCS by the received signal RS, and generates and outputs reception data DT.

Although in this embodiment the deserializer 112 is included in the synchronization establishment unit 11, it can be constituted as a separate member from the synchronization establishment unit 11.

Figure 3:
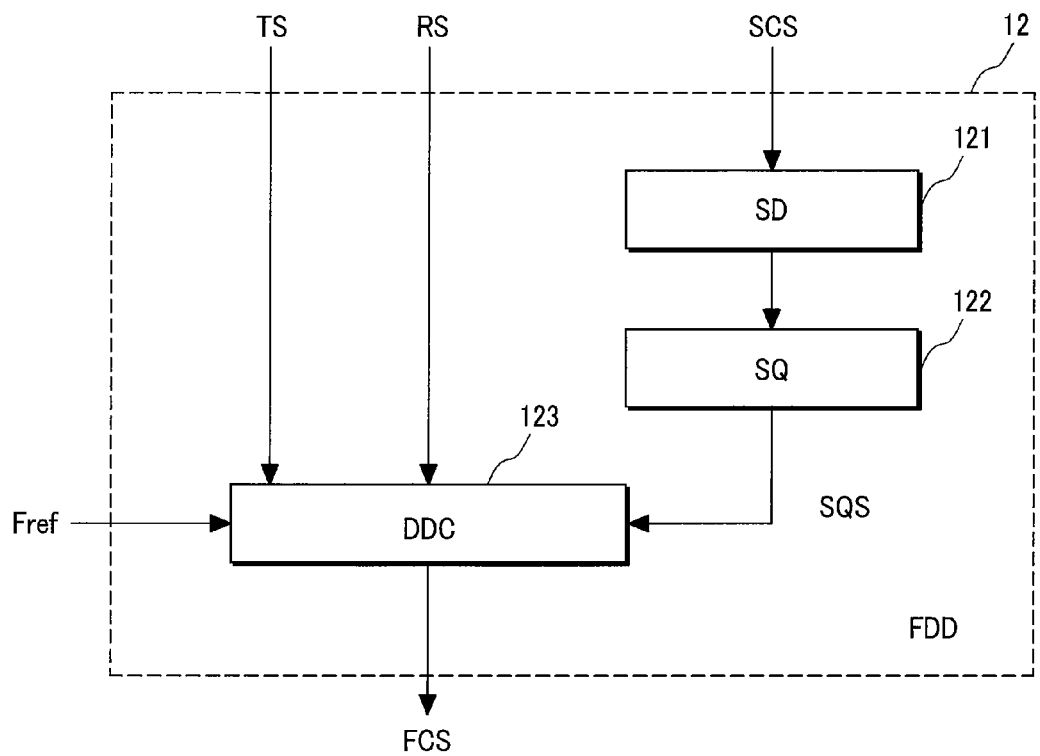
FIG. 3 is a block diagram for explaining an example of a configuration of a frequency difference detector used in the transmitting/receiving device with an automatic coordination function of transmission signals in FIG. 1.

FIG. 3 shows an example of a configuration of the frequency difference detector 12 in the device. The frequency difference detector 12 includes a signal detector SD 121, a sequencer SQ 122, and a frequency difference detection coordinator DDC 123. The signal detector 121 is inputted a synchronous establishment signal SCS to detect data, and outputs a detection result to the sequencer 122. The sequencer 122 to which the detection result is inputted outputs a sequence signal SQS for informing a frequency difference detection sequence to the frequency difference detection coordinator DDC 123. The DDC 123 detects a frequency difference between a received signal RS and a transmitting signal TS, and outputs the detection result as a frequency coordination signal FCS. If it is judged by the sequence signal SQS that the signal is of a frequency difference detection sequence, the frequency of the received signal RS and the frequency of the transmitting signal TS are compared. Here, the comparison time is determined by a reference signal Fref. The comparison result is outputted as the frequency coordination signal FCS. On the other hand, if it is judged by the sequence signal SQS that the signal is not of a frequency difference detection sequence, the comparison of frequencies of the received signal RS and the transmitting signal TS is not carried out.

Figure 4:
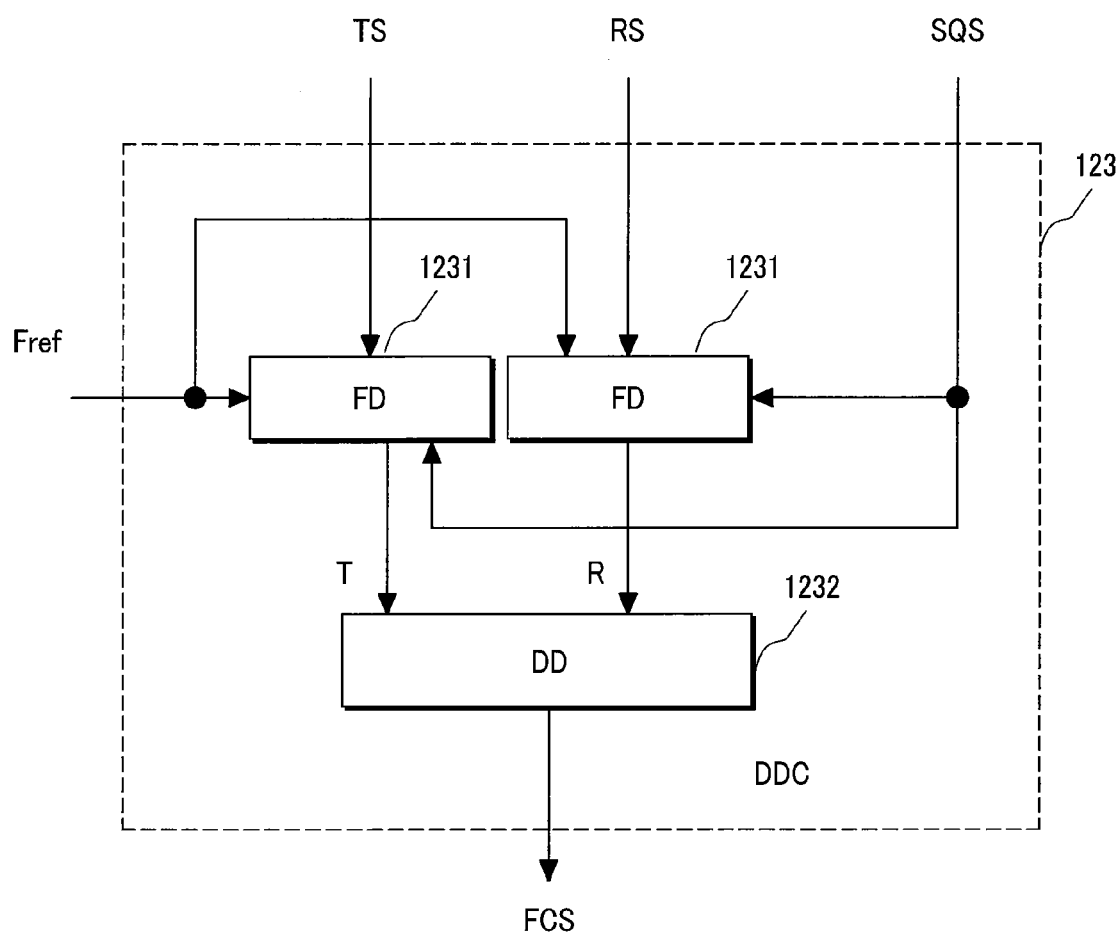
FIG. 4 is a block diagram for explaining an example of a configuration of a frequency difference detection coordinator used in the frequency difference detector in FIG. 3.

FIG. 4 shows an example of a configuration of the frequency difference detection coordinator 123 according to Embodiment 1. The frequency difference detection coordinator 123 includes two frequency detectors DD 1231 and a difference detection circuit 1232.

Figures 5A, 5B:
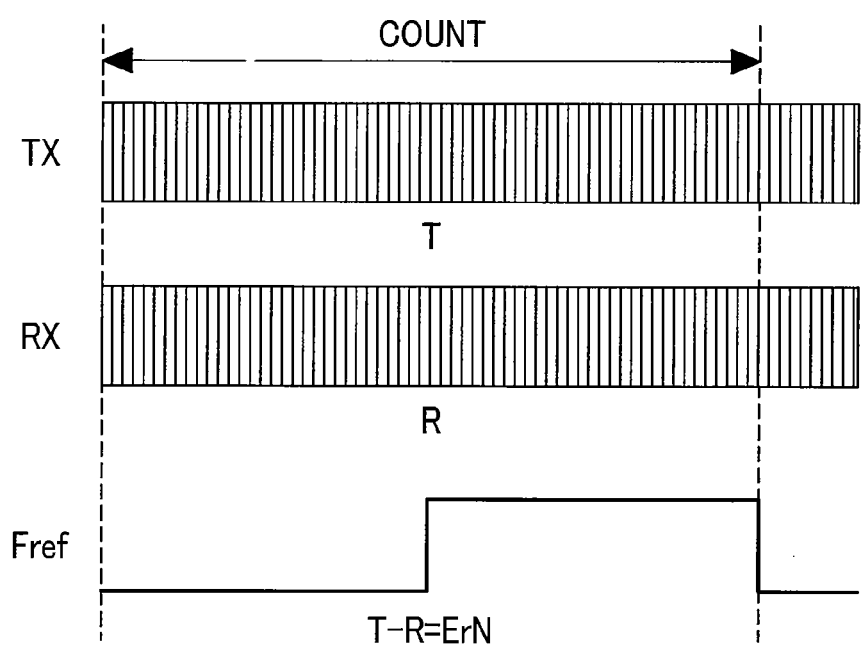
FIG. 5A is a diagram explaining the configuration and operation of a frequency difference coordinator according to Embodiment 1.
FIG. 5B is a diagram explaining the configuration and operation of a frequency difference coordinator according to Embodiment 1.

The following will now describe the configuration and operation of the frequency difference detection coordinator 123 with reference to FIG. 5 (FIGS. 5A and 5B).

As illustrated in FIG. 5A, the difference detection circuit DD 1232 has an FCS table 500 defining a relation between a comparison result of R and T and the frequency coordination signal FCS. The FCS table 500 is a table that predetermines a relation between the frequency deviation DevB of the oscillator 3 and the frequency coordination signal FCS. For example, if the frequency difference ErN between the received signal RX and the transmitting signal TS is C, Nc is given as the frequency coordination signal FCS.

In the difference detection circuit DD 1232, if the sequence signal SQS informing a frequency difference detection sequence is inputted and judged as a frequency difference detection sequence, the frequency detector FD 1231 counts the pulse of the received signal RS and the transmitting signal TS, respectively, as shown in FIG. 5B. Here, the comparison time is determined by a reference signal Fref. These count results of the received signal RS and transmitting signal TS are outputted as R and T, respectively, from the frequency detector FD 1231, and are inputted to the difference detection circuit DD 1232. The difference detection circuit DD 1232 compares the number of counts of the received signal R and the number of counts of the transmitting signal T, refers to the FCS table 500 based on the comparison result, and outputs a frequency coordination signal FCS.

Figure 6:
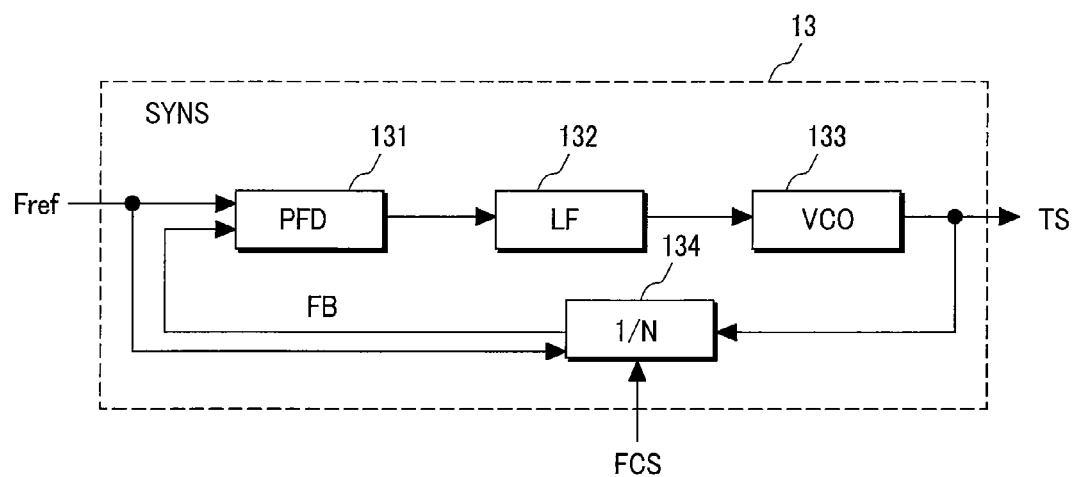
FIG. 6 is a block diagram for explaining an example of a configuration of a frequency generator used in the transmitting/receiving device with an automatic coordination function of transmission signals in FIG. 1.

FIG. 6 shows an example of a configuration of a frequency generator SYNS 13 in the device 1 according to Embodiment 1. The frequency generator SYNS 13 is a so-called phase-locked loop (PLL) consisting of a phase-frequency detector PFD 131, a loop filter LF 132, a VCO 133, and a variable frequency divider (1/N) 134. More preferably, a fractional PLL realizing fractional frequency division is utilized.

The phase-frequency detector 131 compares phases and frequencies of a reference signal Fref and an output signal of the variable frequency divider 134, and outputs a comparison result to the loop filter 132. The loop filter 132 makes the comparison result into a DC signal, and outputs it as a control voltage to the VCO 133. The VCO 133 outputs an output signal having a frequency coordinated by the control voltage as a transmitting signal TS. The transmitting signal TS is outputted from the frequency generator SYNS 13 and, at the same time, is inputted to the variable frequency divider 134. The frequency generator SYNS 13 divides the transmitting signal TS by a certain number of frequency division, and outputs the frequency division signal to the phase-frequency detector PFD 131. Here, the variable frequency divider 134 can control the number of frequency division by a frequency coordination signal FCS generated by the frequency difference detection coordinator 123.

Figure 7:
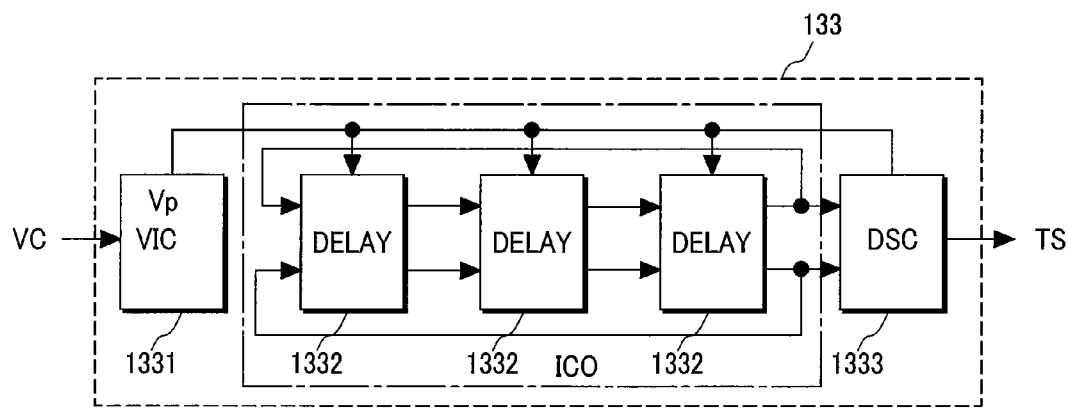
FIG. 7 is a block diagram for explaining an example of a configuration of a voltage controlled oscillator used for synchronization establishment in FIG. 2 and the frequency generator in FIG. 6.

FIG. 7 shows an example of a configuration of the VCO 133 in the frequency generator 13 according to Embodiment 1. The VCO 133 includes a voltage-to-current converter (VIC) circuit 1331, a plurality of delay circuits 1332 each of which comprised a differential inverter, and a differential to single-ended converter (DSC) circuit 1333, in which each of the delay circuit 1332 has a ring shape forming a current controlled ring oscillator (ICO). When a control voltage Vc is inputted to the VCO 133, a control signal Vp is outputted from VIC circuit 1331. By this control signal Vp, the delay amount of the delay circuit 1332 of the ICO is adjusted. The DSC 1333 converts differential signals of those delay circuits 1332 into a single signal, and outputs it as an output signal (=transmitting signal TS).

Figure 8:
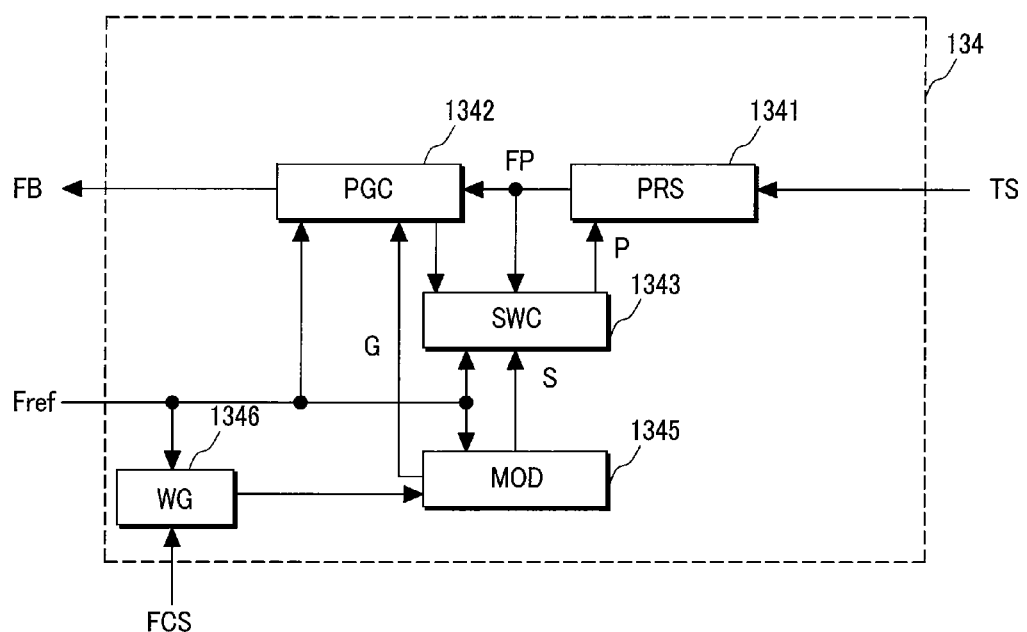
FIG. 8 is a block diagram for explaining an example of a configuration of a variable frequency divider used in the frequency generator in FIG. 6.

FIG. 8 shows an example of a configuration of the variable frequency divider 134 in the frequency generator 13 according to Embodiment 1. The variable frequency divider 134 includes a prescaler PRS 1341, a programmable counter PGC 1342, a swallow counter SWC 1343, a modulator MOD 1345, and a waveform generating unit WG 1346. The prescaler 1341, the programmable counter 1342, and the swallow counter 1343 are, so to speak, a pulse swallow counter.

The waveform generating unit WG 1346 generates a waveform or a predetermined value determined by the number of frequency division, adds it to the frequency coordination signal FCS, and outputs an addition result to the modulator MOD 1345. The modulator MOD 1345 is inputted the output signal from the wave form generating unit WG 1346, and outputs a modulation result as G and S to the programmable counter PGC 1342 and the swallow counter SWC 1343, respectively. For instance, upper bits of the output signal from the modulator MOD 1345 are outputted as G, while lower bits as S. For the modulator 1345, a sigma-delta modulator is desirable, but other type diverse other than the sigma-delta modulator can also be employed.

The prescaler 1341 receives the transmitting signal TS and the output P from the swallow counter 1343, and its output FP is inputted to the programmable counter PGC 1342 and the swallow counter SWC 1343.

The number of frequency division of the programmable counter PGC 1342 and that of the swallow counter SWC 1343 are controlled by G and S, the output signals from the modulator MOD 1345.

Here, when a value of the frequency coordination signal FCS changes, the waveform or the predetermined value to be inputted to the modulator MOD 1345 also changes. Since the modulator's output signals G and S change accordingly, the number of frequency division of the variable frequency divider 134 changes. In short, the number of frequency division of the variable frequency divider 134 is controlled by the frequency coordination signal FCS. Because of this, when the frequency coordination signal FCS changes, the frequency of the transmitting signal TS generated by the frequency generator 13 is changed.

In Embodiment 1, in the case that the synchronization control unit detects a frequency difference detection sequence from the relation of a transmitting signal and a received signal between the host 2 and the device, the frequency of the received signal RS and the frequency of the transmitting signal TS are compared, and based on a comparison result thereof the number of frequency division of the frequency generator 13 is changed by the frequency coordination signal FCS to change the frequency of the transmitting signal TS. In this manner, the frequency difference between the received signal RS and the transmitting signal TS is reduced, and the (transmitting/receiving) communication between the host 2 and the device 1 is realized.

Figure 9A:
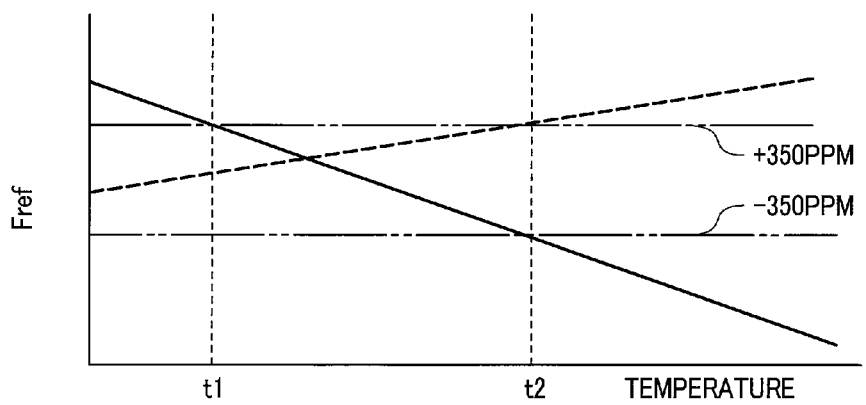
FIG. 9A is a diagram illustrating a characteristic of a ceramic resonator used in Embodiment 1.
Figure 9B:
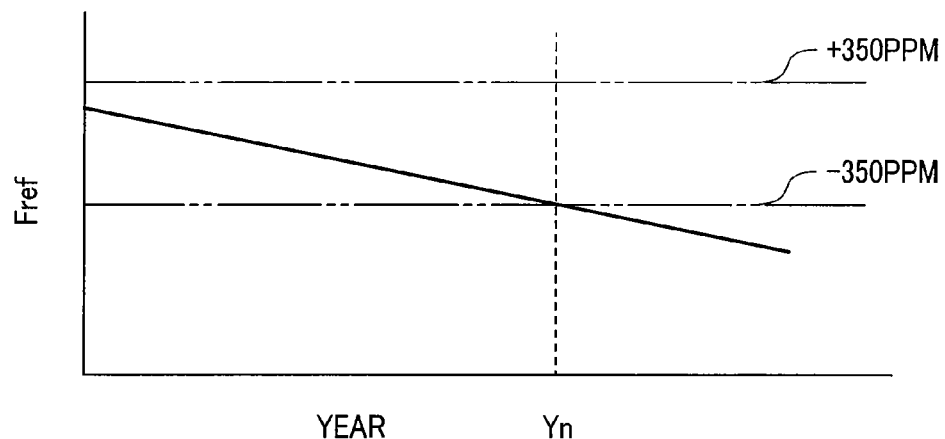
FIG. 9B is a diagram illustrating a characteristic of a ceramic resonator used in Embodiment 1.
Figure 9C:
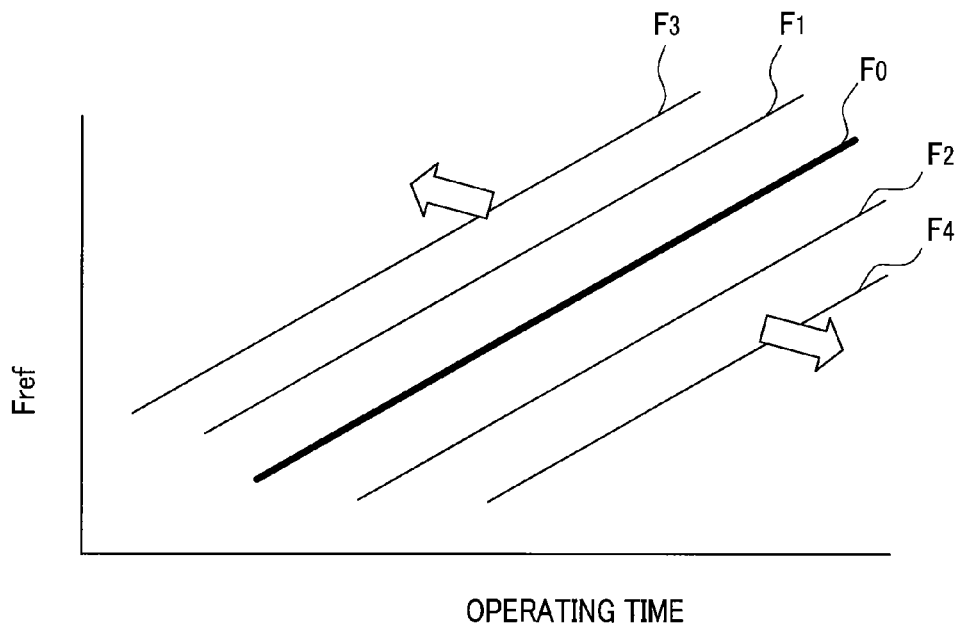
FIG. 9C is a diagram illustrating a characteristic of a ceramic resonator used in Embodiment 1.

One of features of the present invention lies in the fact that it utilizes an inexpensive oscillator, such as a ceramic resonator, as the oscillator 3. FIG. 9 (FIGS. 9A, 9B and 9C) illustrate an example of the ceramic resonator. FIG. 9A shows a temperature characteristic of the ceramic resonator. The oscillation frequency Fref of the ceramic oscillator is dependent on temperature. As indicated by a solid line, if a temperature exceeds temperatures t1 and t2, the frequency deviation DevB of the oscillation frequency Fref changes out of its allowable range (or tolerance)±350 PPM. Also, as indicated by a dotted line, the temperature characteristic may exhibit the opposite trend.

In addition, as shown in FIG. 9B, characteristics of the ceramic resonator change by time. For example, the frequency deviation DevB of the oscillation frequency Fref may change exceeding its allowable range (tolerance)±350 PPM after several years since its initial usage.

One of characteristics of the resonator includes a frequency deviation due to a manufacturing process.

Moreover, temperature of the ceramic resonator increases almost proportionally to its operating time. Thus, the oscillation frequency Fref of the ceramic resonator in use changes, as shown in FIG. 9C, almost proportionally to the operating time. The features F1-F4 shown in FIG. 9C reflect frequency deviations from the initial feature F0 under the influence of the elapsed time or due to the manufacturing process.

According to this embodiment, the synchronization control unit of the device detects an output signal from the host, and if a deviation range of the frequency of the oscillator exceeds a guarantee range required for establishing communication, the device controls an output frequency for itself and establishes the communication.

With reference to FIGS. 1-10, the following will now explain the operation of the synchronization control unit.

FIG. 10 illustrates an example of a sequence at the time of recovery from power-on and power save modes of the transmitting/receiving device for use in the host 2 and the device 1.

A predetermined sync signal is transmitted as RX from the host 2 to the device 1 (S1001). The device 1 receives the predetermined sync signal being transmitted as RX, and its synchronization establishment unit 11 performs a synchronization establishment process by outputting a received signal RS and a synchronization establishment signal SCS (S1002). In addition, the frequency difference detector 12 to which the received signal RS and the synchronization establishment signal SCS are inputted performs a frequency difference detection process (S1003), compares the frequency of the transmitting signal TS outputted from the frequency generator 13 with the frequency of the received signal RS, and judges whether the frequency deviation DevC of the transmitting signal TS from an absolute value of a comparison result (T−R) satisfies a condition with respect to the allowable frequency deviation DevA of the transmitting signal TS, i.e., DevA<DevC (S1004).

If the above relation is met, a predetermined frequency coordination signal FCS based on the data of the reference table 500 is outputted (S1005). The frequency generator 13 to which the frequency coordination signal FCS is inputted changes the number of frequency division by the frequency coordination signal FCS performing a frequency coordination process to change the frequency of the transmitting signal TS, and outputs the transmitting signal TS with a changed frequency (S1006).

The transmitting signal TS with a changed frequency is then inputted to the frequency difference detector 12, and its frequency is compared again with the frequency of the received signal RS. This operation is repeated until a comparison result falls within a certain allowable range. When the comparison results falls within the certain allowable range, the frequency coordination signal FCS outputs the same value continuously.

The allowable ranges of the frequency coordination of the received signal RS and the transmitting signal TS are set by the transmission signal automatic coordination transmitting/receiving device of this embodiment in a manner that the host 2 can recognize the output signal TX from the device 1.

Upon completing the frequency coordination, the device 1 extracts a transmission data DR from the serializer 14 with a transmitting signal TS, and outputs it to the host 2 as the output signal TX of the device 1 (S1007).

In addition, at the judgment step S1004, if the frequency deviation DevC of the transmitting signal TS falls within the allowable range, frequency coordination is not carried out and the output signal TX from the device 1 is outputted to the host 2 (S1007).

Having received the TX, the host 2 detects the signal from the device 1 (S1008), and outputs a fixed pattern signal as RX to the device 1 (S1009).

Upon receiving the fixed pattern signal as the RX, the device 1 receives the fixed pattern signal through its synchronization establishment unit 11, and outputs a received signal RS and a synchronization establishment signal SCS (S1010). At this time, a frequency difference between the received signal RS and the transmitting signal TS should fall within an allowable range in order to establish communication. The transmitting signal TS is inputted to the serializer 14 and the transmission data DR is extracted. The output signal TX of the device 1 is outputted to the host 2 as communication data (S1101).

Having received the communication data TX, the host 2 detects a signal (S1012) and transmits its communication data as RX (S1013) to the device 1 (S1014). In this manner, bidirectional communication between the host 2 and the device 1 is realized.

Figure 11:
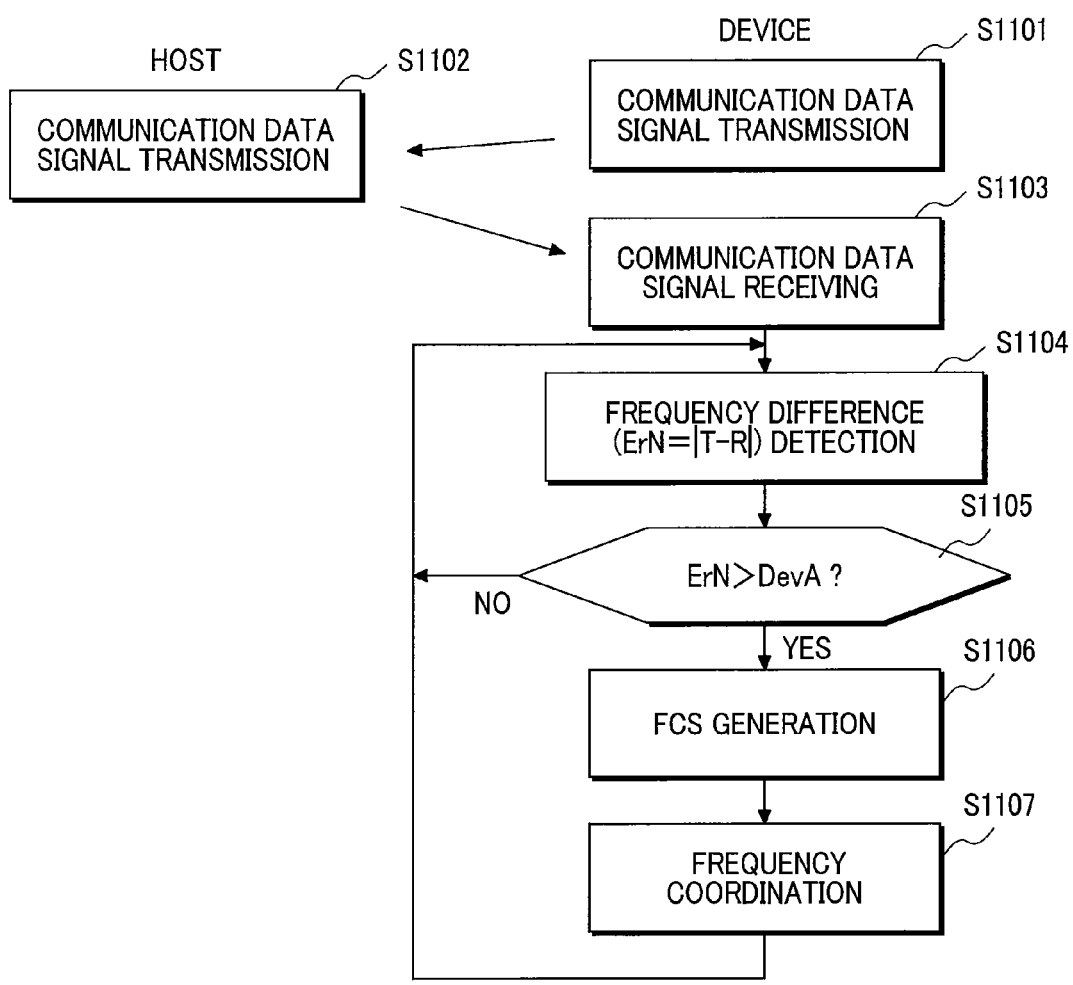
FIG. 11 is a sequence of a frequency coordination process when the transmitting/receiving device with an automatic coordination function of transmission signals according to Embodiment 1 of the present invention shown in FIG. 1 is in communication establishment status.

FIG. 11 illustrates a frequency coordination sequence according to Embodiment 1 during the communication establishment between transmitting/receiving devices in a communication system, that is, the host 2 and the device 1. This sequence is a frequency coordination sequence, assuming that the communication is already established between the host 2 and the device 1. Namely, a frequency difference between the received signal RS and the transmitting signal TS must fall within an allowable range for establishing the communication. However, due to the deviation of the oscillator 3 related to a change in elapsed time or temperature change, and if this frequency coordination is not performed, the frequency difference between the received signal RS and the transmitting signal TS exceeds the allowable range for establishing communication so that the communication may not be established at all. This is why the frequency coordination is performed frequently while establishing the communication.

In the initial state, the device 1 transmits communication data as TX to the host 2 (S1101). The host 2 also transmits communication data as RX to the device 1 (S1102). Meanwhile, having received from the host 2 the communication data as the RX (S1103), the device 1 generates and outputs a received signal RS and a synchronization establishment signal SCS following the sequence explained in FIG. 10. The received signal RS and the transmitting signal TS outputted from the frequency generator 13 are inputted to the frequency difference detector 12, and the frequency difference detector 12 compares the frequency of the transmitting signal TS from the frequency generator 13 and the frequency of the received signal RS and outputs a frequency coordination signal FCS obtained from an absolute value of the comparison result (T−R) (S1104-S1106). The frequency generator 13 having received the frequency coordination signal FCS changes the number of frequency division by the received frequency coordination signal FCS, changes and outputs the frequency of a transmitting signal TS, and thereby performs frequency coordination (S1107).

In addition, the transmitting signal TS having a changed frequency is inputted to the frequency difference detector 12 and is compared again with the frequency of the receiving signal RS. This process is repeated until the comparison result falls within a certain allowable range. When the comparison result falls within the certain allowable range, the frequency coordination signal FCS outputs the same value continuously. This frequency coordination process continues during the communication establishment of the transmission signal automatic coordination transmitting/receiving device.

Figure 12:
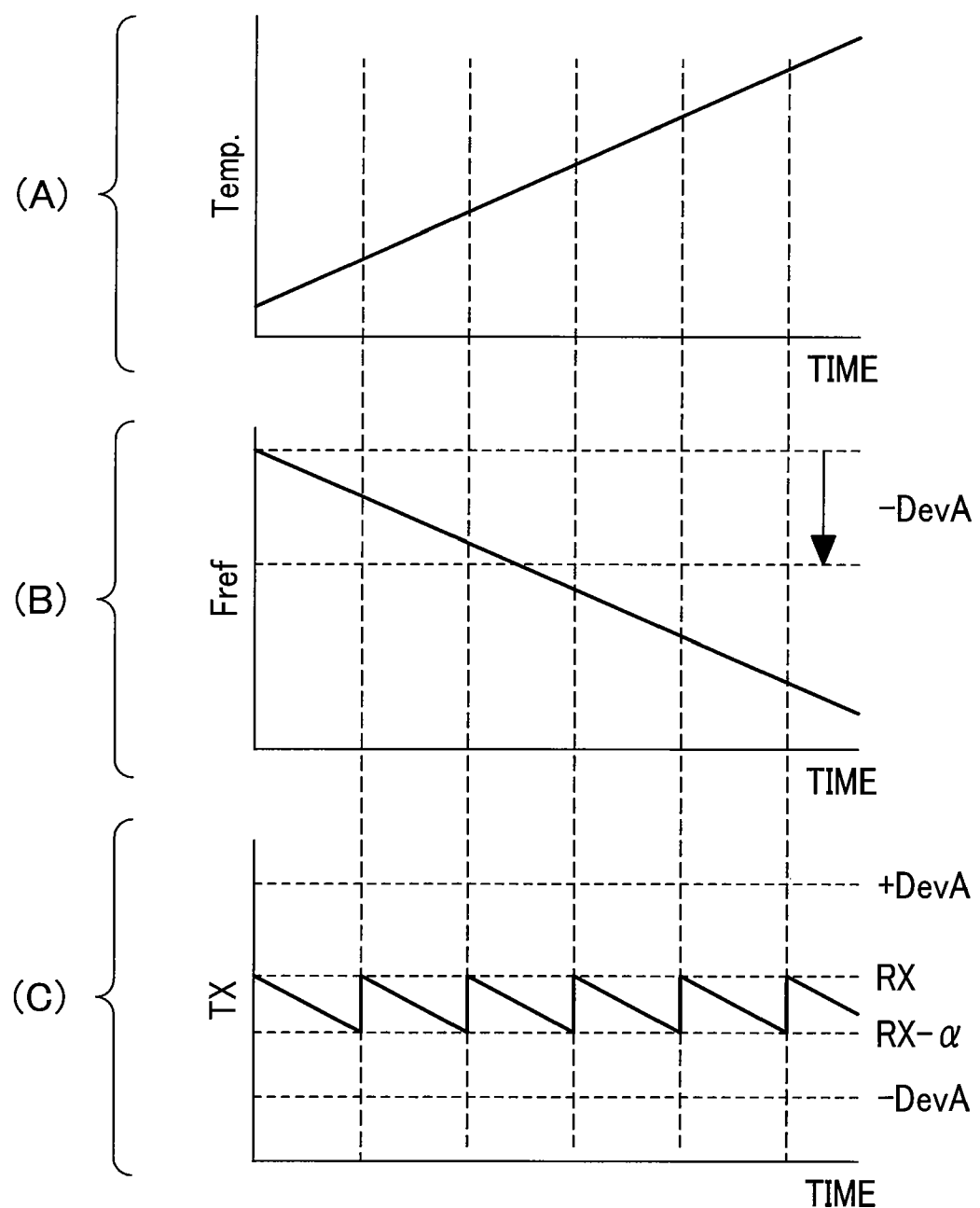
FIG. 12 is a diagram showing an example of frequency coordination by a synchronization establishment unit during communication establishment of the communication system in Embodiment 1.

FIG. 12 illustrates an example of frequency coordination by the synchronization establishment unit 11 during the communication establishment of a communication system.

The remainder of the discussion hereinbelow assumes that a ceramic oscillator in an operating mode undergoes a temperature change shown in (A) of the upper portion of FIG. 12, an oscillation frequency Fref of the ceramic oscillator is reduced with respect to the operating time as shown in (B) in the middle portion of FIG. 12 because of the temperature change, and the frequency deviation DevB of the ceramic oscillator departs from an allowable value DevA within a relatively short period of time.

According to this embodiment, before the frequency deviation DevB of the ceramic oscillator departs from the allowable value DevA, that is, when the frequency detection detector 12 compared the frequency of a transmitting signal TS outputted from the frequency generator 13 and the frequency of a received signal RS which is the output signal from the synchronization establishment unit 11, if an absolute value of the difference (T−R) reaches a certain value α (α<DevA), it is judged and a frequency coordination signal FCS is generated to coordinate the frequency and the transmitting signal TS becomes the received signal RS. Because of this, even though the frequency deviation DevB of the ceramic oscillator exhibits a temperature characteristic that goes far beyond the allowable value DevA as shown in (C) in the lower portion of FIG. 12, the transmitting signal TS of the device is controlled by a small frequency deviation α with respect to the frequency deviation DevA.

Therefore, according to this embodiment, although the device uses an inexpensive oscillator as a reference signal generating source where the oscillator's manufacturing accuracy, temperature change and change in elapsed time are outside of a required allowable range, since the device itself makes the output signal frequency difference between the host and the device fall within the required allowable range for establishing communication, bidirectional communication between the host and the device can be realized. Because of this, it is not always required to use a high-price oscillator, e.g., a crystal oscillator, with a stable capacity requirement upon mounting on a board, but a low-price oscillator, e.g., a ceramic oscillator, without a stable capacity requirement upon mounting on the board becomes possible, and the price of a transmitting/receiving device having an automatic coordination function of transmission signals and being excellent in adaptability can be reduced.

Moreover, since the device itself coordinates the frequency, it is no longer necessary for a person to manually coordinate the frequency during the test process at the time of shipping. This contributes to real cost reduction of the test process and eventually, it leads to cost reduction of the transmitting/receiving device with an automatic coordination function of transmission signals.

In addition, in the device, the frequency of the transmitting signal of the device and the frequency of the received signal from the host are compared and the frequency coordination is performed therein based on the frequency deviation. Thus, it is possible to provide a low-price semiconductor IC device, in which the output from the frequency generator of the device is not under the influence of noises included in the transmitting/received signal, and which is excellent in adaptability and capable of bidirectional communication facilitating the accommodation to high-speed transmission with a strict noise specification.

Embodiment 2

A communication system with an automatic coordination function of transmission signals according to a second embodiment of the present invention will now be explained with reference to FIGS. 13-19.

Figure 13:
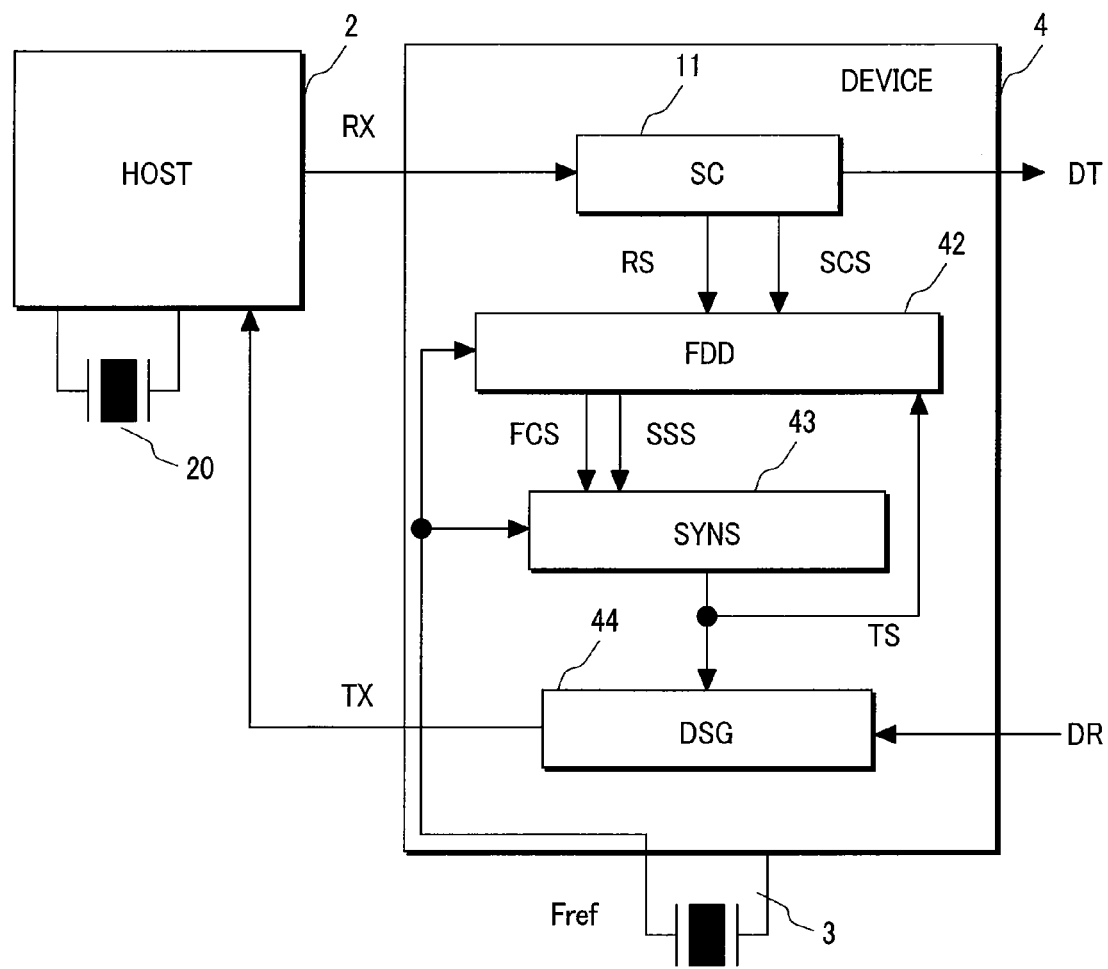
FIG. 13 is a block diagram for explaining a transmitting/receiving device with an automatic coordination function of transmission signals according to Embodiment 2.

FIG. 13 is a block diagram for explaining an overall configuration of the communication system according to Embodiment 2.

The communication system in this embodiment includes a host 2 which outputs RX to a device 1 and receives TX from the device 1, the device 1 which receives RX from the host 2 and outputs a reception data DT and which receives a transmission data DR and transmits TX to the host 2, an oscillator 3 inputting a reference signal Fref to the device 1, and a transmitting/receiving device which includes a case where transmitting/receiving signal frequencies of spread spectrum (SSC) performed by serial ATA and the like are not uniform.

The device 1 includes a synchronization establishment unit 11 which is inputted the RX the device 1 received, extracts a clock and data from the RX to generate a received signal RS and a synchronization establishment signal SCS, respectively, and outputs the reception data DT; a frequency difference detector FDD 42 which is inputted the received signal RS, the synchronization establishment signal SCS, the reference signal Fref, and the transmitting signal TS, and outputs a frequency coordination signal FCS by detecting a frequency difference between the received signal RS and the transmitting signal TS; a frequency generator SYNS 43 which is inputted the frequency coordination signal FCS and the reference signal Fref, and outputs the transmitting signal TS of which frequency is determined based on the frequency coordination signal FCS and the reference signal Fref; and a digital signal generator DSG 44 which is inputted the transmitting signal TS and the transmission data DR, and outputs the TX. The device of Embodiment 2 is also characterized by including a synchronization control unit consisting of the synchronization establishment unit 11, the frequency difference detector 42, and the frequency generator 43.

Figure 14:
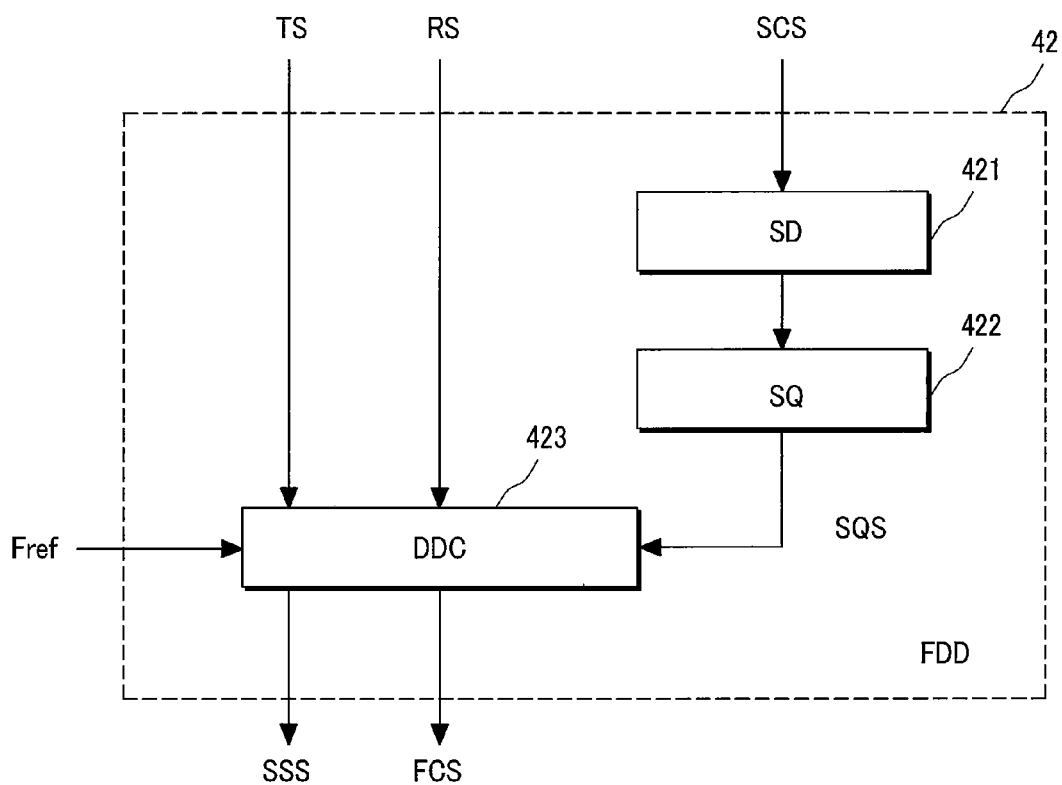
FIG. 14 is a block diagram for explaining an example of a configuration of a frequency difference detector used in the transmitting/receiving device with an automatic coordination function of transmission signals in FIG. 13.

FIG. 14 shows an example of a configuration of the frequency difference detector 42 in the device according to Embodiment 2. The frequency difference detector 42 includes a signal detector 421, a sequencer 422, and a frequency difference detection coordinator 423. The signal detector 421 is inputted a synchronous establishment signal SCS to detect data, and outputs a detection result to the sequencer 422. The sequencer 422 to which the detection result is inputted outputs a sequence signal SQS for informing a frequency difference detection sequence to the frequency difference detection coordinator 423. The frequency difference detection coordinator 423 judges whether the received signal RS is a spread spectrum signal and outputs its judgment result as an SSC selection signal SSS, and detects a frequency difference between a received signal RS and a transmitting signal TS and outputs the detection result as a frequency coordination signal FCS. If it is judged by the sequence signal SQS that the signal is of a frequency difference detection sequence, the frequency of the received signal RS and the frequency of the transmitting signal TS are compared. Here, the comparison time is determined by a reference signal Fref (please refer to FIG. 5B). The comparison result (T−R) is outputted as the frequency coordination signal FCS. On the other hand, if it is judged by the sequence signal SQS that the signal is not of a frequency difference detection sequence, the comparison of frequencies of the received signal RS and the transmitting signal TS is not carried out.

Figure 15:
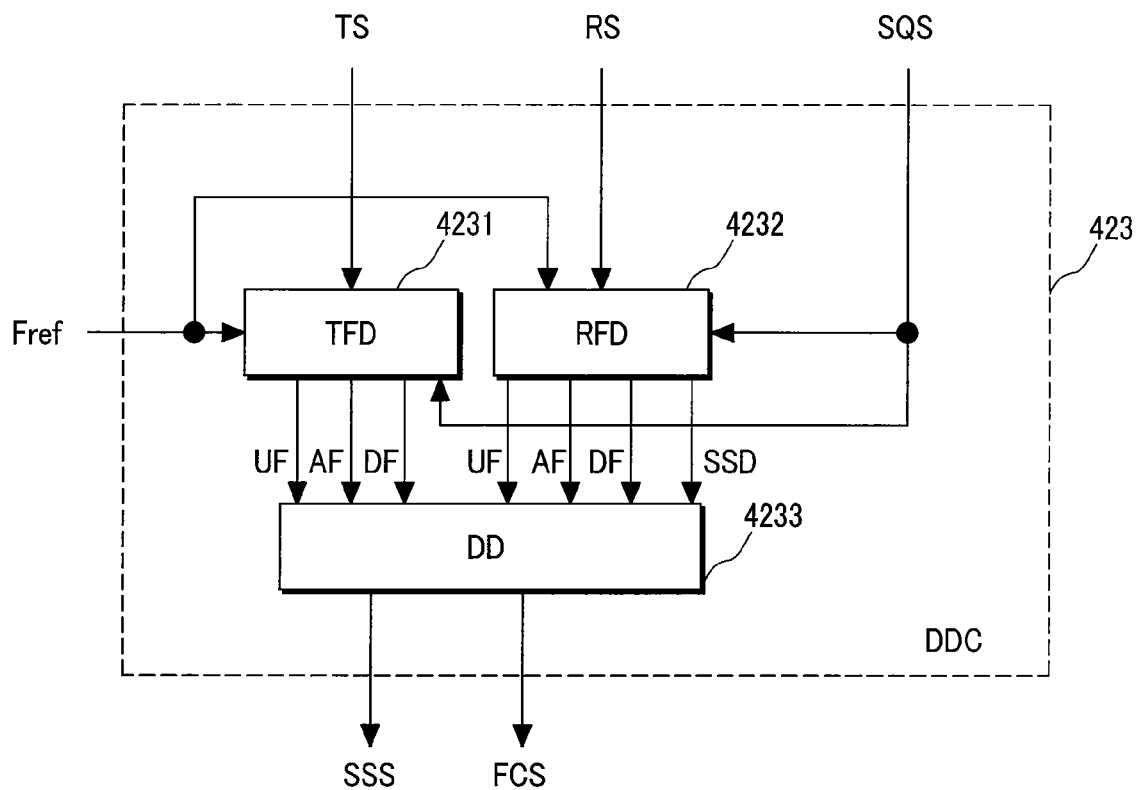
FIG. 15 is a block diagram for explaining an example of a configuration of a frequency difference detection coordinator used in the frequency difference detector in FIG. 14.

FIG. 15 shows an example of a configuration of the frequency difference detection coordinator 423 according to Embodiment 2. The frequency difference detection coordinator 423 includes a transmitting signal frequency detector TFD 4231, a received signal frequency detector RFD 4232, and a difference detection circuit DD 4233. If it is judged by the sequence signal SQS that the signal is of a frequency difference detection sequence, the transmitting signal frequency detector TFD 4231 and the received signal frequency detector RFD 4232 count pulse of the received signal RS and the transmitting signal TS, respectively. Here, the counting time is determined by a reference signal Fref.

Figure 16:
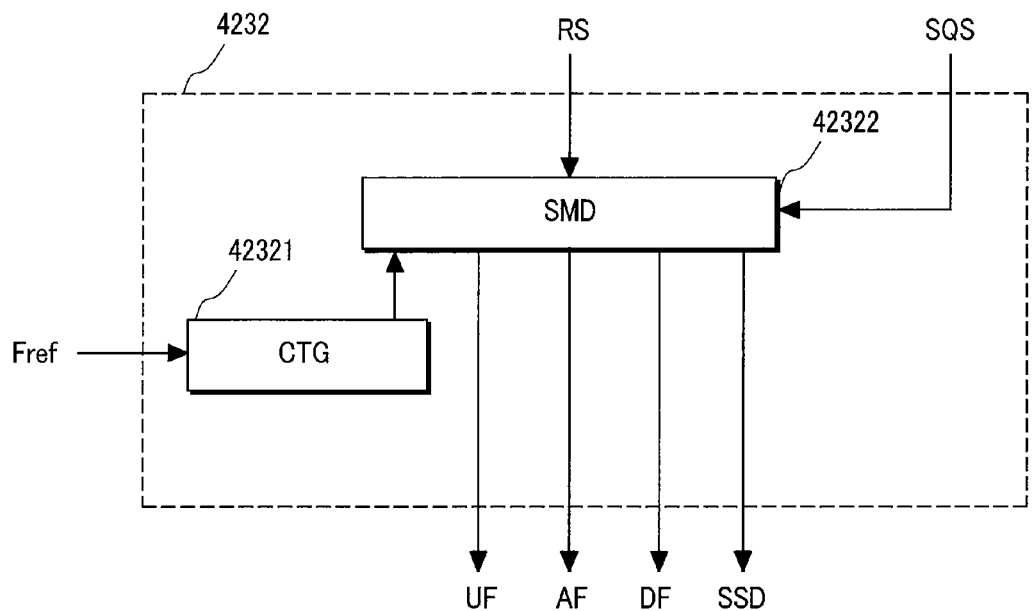
FIG. 16 is a block diagram for explaining an example of a configuration of a received frequency detector used in the frequency difference detection coordinator shown in FIG. 15.

FIG. 16 illustrates an example of a configuration of the received signal frequency detector RFD 4232. The received signal frequency detector RFD 4232 includes a counting time generator CTG 42321 and an SSC mode detector SMD 42322. The counting time generator 42321 receives a reference signal Fref, generates a counting time and outputs it to the SSC mode detector 42322. The SSC mode detector 42322 to which the sequence signal SQS, the received signal RS, and the counting time are inputted outputs an upper limit frequency UF, an average frequency AF, a lower limit frequency DF, and an SSC mode decision signal SSD.

Figure 17:
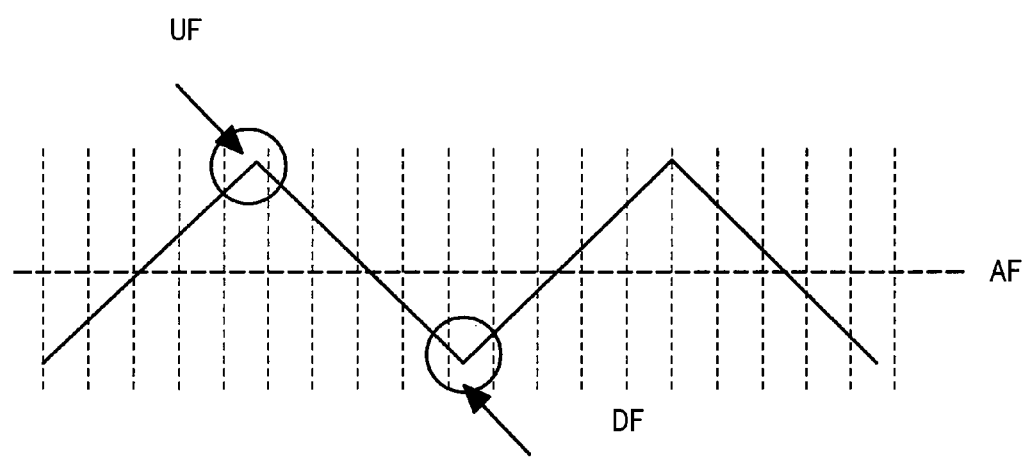
FIG. 17 is a diagram for explaining an upper limit frequency (UF), an average frequency (AF), and a lower limit frequency (DF), which are output signals from the received frequency detector shown in FIG. 16.

FIG. 17 is a diagram illustrating that the transmitting signal frequency detector TFD 4231 and the received signal frequency detector RFD 4232 count frequency as the transmitting signal TS and the received signal RS are being spread. In the case that the received signal RS is being spread, as depicted in FIG. 17, the upper limit frequency UF, the average frequency AF, and the lower limit frequency DF are counted. At this time, there is a frequency difference between the upper limit frequency UF and the lower limit frequency DF.

Here, the SSC mode detector 42322 detects that the received signal RS is being spread and outputs an SSC mode decision signal SSD as such. On the other hand, if the received signal RS is not being spread, there is no frequency difference between the upper limit frequency UF and the lower limit frequency DF. In this case, the SSC mode detector 42322 detects that the received signal RS is not being spread and outputs an SSC mode decision signal SSD as such.

Going back to FIG. 15, when the SSC mode decision signal SSD is outputted based on an assumption that the transmitting signal TS and the received signal TS are being spread, the transmitting signal frequency detector TFD 4231 and the received signal frequency detector RFD 4232 take a sufficiently short counting time with respect to the spread time, and output the upper limit frequency UF, the average frequency AF, and the lower limit frequency DF.

Figure 18:
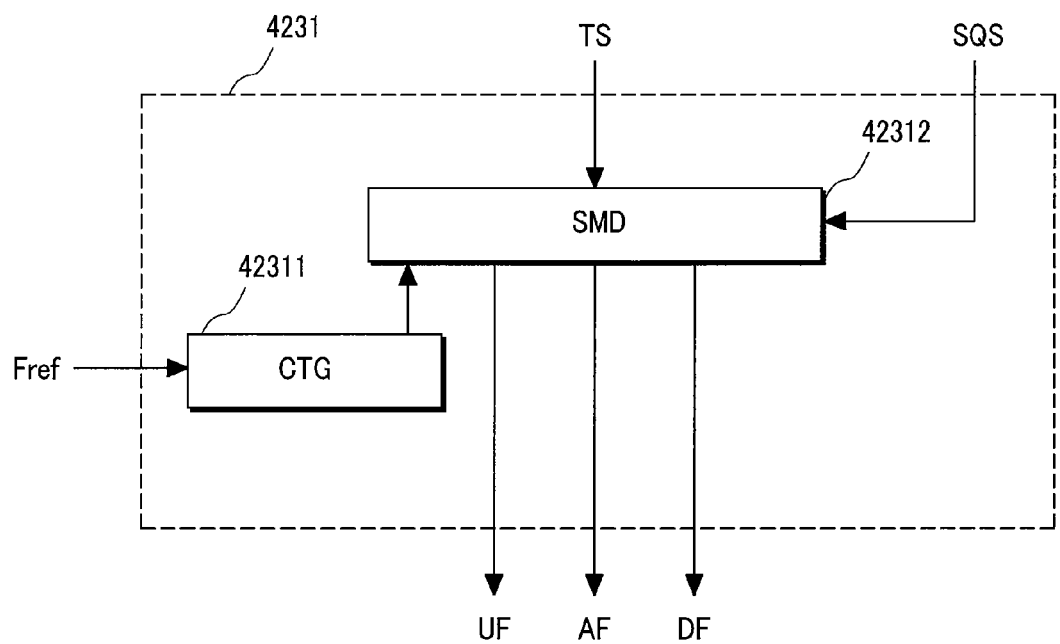
FIG. 18 is a block diagram for explaining a configuration of a transmitting frequency detector used in the frequency difference detector in FIG. 15.

FIG. 18 shows an example of a configuration of the transmitting signal frequency detector TFD 4231. Since its operation is the same as the received signal frequency detector RFD 4232 shown in FIG. 16, it will not be explained here.

The configuration of the frequency generator SYNS 43 in the device 1 according to Embodiment 2 is identical with that of the frequency generator SYNS 13 shown in FIG. 6. The frequency generator SYNS 43 is a PLL capable of realizing a fractional frequency division. As a modulated wave such as a triangular wave is outputted from the waveform generating unit 1346 used in a variable frequency divider 134, it becomes possible to make the transmitting signal TS a spread-spectrum signal.

Figure 19:
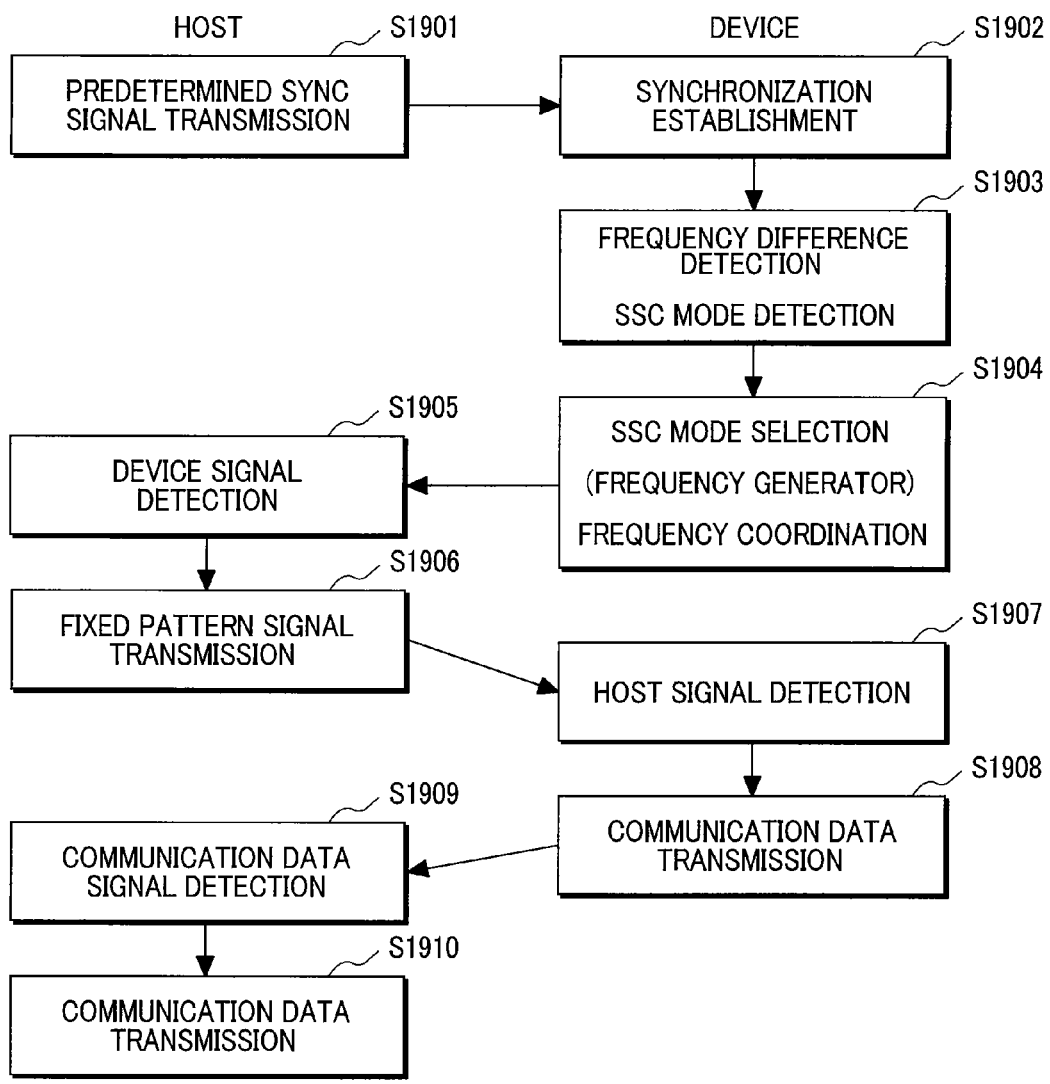
FIG. 19 is flow chart explaining a frequency coordination process at the time of recovery from power-on and power save modes of Embodiment 2 shown in FIG. 13.

FIG. 19 shows an example of a sequence at the time of recovery from power-on and power save modes of the transmitting/receiving device for use in the host 2 and the device 1 according to Embodiment 2.

A predetermined sync signal is transmitted as RX from the host 2 to a device 1 (S1901). The device 1 receives the predetermined sync signal being transmitted as RX, and its synchronization establishment unit 11 outputs a received signal RS and a synchronization establishment signal SCS (S1902). The frequency difference detector 42 to which the received signal RS and the synchronization establishment signal SCS are inputted detects an upper limit frequency UF and a lower limit frequency DF of the received signal RS; and outputs an SSC mode decision signal SSD which decides whether spread spectrum is performed and a frequency coordination signal FCS which is from a comparison result obtained by comparing the frequency of a transmitting signal TS outputted from the frequency generator 43 and the frequency of the received signal RS (S1903). The received signal RS and the transmitting signal TS can determine independently from each other whether to enter spread spectrum mode. That is to say, although the received signal RS is not performing spread spectrum, the transmitting signal TS can perform spread spectrum, and vice versa.

In the case that the received signal RS is not performing spread spectrum, there is no frequency difference between an upper limit frequency UF and a lower limit frequency DF. Hence, the received signal frequency detector RFD 4232 detects that the received signal RS is not performing spread spectrum and thus, outputs an SSC mode decision signal SSD. The average frequency AF at this time becomes the frequency of the received signal RS.

Meanwhile, if the frequency generator 43 does not perform spread spectrum, it means that the transmitting signal TS is a signal of a uniform frequency. Since this case corresponds to the example described in Embodiment 1, it will not be explained hereinafter.

However, if the frequency generator 43 performs spread spectrum, it means that the transmitting signal TS is not a signal of a uniform frequency. At this time, the operation of the frequency difference detector 42 is changed, depending on the spread spectrum spec allowed by communication standard (S1904).

In case of a down spread where spread spectrum regulates an upper limit frequency as in serial ATA, the frequency difference detector 42 compares the average frequency AF of the received signal RS and the upper limit frequency UF of the transmitting signal TS, outputs a frequency coordination signal FCS from the comparison result and therefore, controls the frequency generator 43 so that the average frequency AF of the received signal RS and the upper limit frequency UF of the transmitting signal TS coincide with each other.

On the other hand, in the case that a central frequency of spread spectrum is regulated, the frequency difference detector 42 compares the average frequency AF of the received signal RS and the average frequency AF of the transmitting signal TS, outputs a frequency coordination signal FCS from the comparison result and therefore, controls the frequency generator 43 so that the average frequency AF of the received signal RS and the average frequency AF of the transmitting signal TS coincide with each other.

When the received signal RS performs spread spectrum, the received signal frequency detector RFD 4232 detects based on a frequency difference between the upper limit frequency UF and the lower limit frequency DF that the received signal RS is performing spread spectrum and thus, outputs an SSC mode decision signal SSD. The average frequency AF at this time becomes an average frequency of a long period of the received signal RS.

If the frequency generator 43 does not perform spread spectrum, it means that the transmitting signal TS is a signal of a uniform frequency. At this time, the operation of the frequency difference detector 42 is changed, depending on the spread spectrum spec allowed by communication standard.

Similar to the serial ATA, in the case of a down spread where spread spectrum regulates an upper limit frequency, the frequency difference detector 42 compares the upper limit frequency UF of the received signal RS and the average frequency AF of the transmitting signal TS, outputs a frequency coordination signal FCS from the comparison result and therefore, controls the frequency generator 43 so that the upper limit frequency UF of the received signal RS and the average frequency AF of the transmitting signal TS coincide with each other.

On the other hand, in the case that a central frequency of spread spectrum is regulated, the frequency difference detector 42 compares the average frequency AF of the received signal RS and the average frequency AF of the transmitting signal TS, outputs a frequency coordination signal FCS from the comparison result and therefore, controls the frequency generator 43 so that the average frequency AF of the received signal RS and the average frequency AF of the transmitting signal TS coincide with each other.

If the frequency generator 43 performs spread spectrum, it means that the transmitting signal TS does not have a uniform frequency. At this time, the frequency difference detector 42 compares the average frequency AF of the received signal RS and the average frequency AF of the transmitting signal TS, outputs a frequency coordination signal FCS from the comparison result and therefore, controls the frequency generator 43 so that the average frequency AF of the received signal RS and the average frequency AF of the transmitting signal TS coincide with each other. In addition, the frequency difference detector 42 compares the upper limit frequency UF and lower limit frequency DF of the received signal RS and the upper limit frequency UF and lower limit frequency DF of the transmitting signal TS, thereby making the spread spectrum modulation factor of the received signal RS and of the transmitting signal TS coincide with each other.

Similarly, by performing the above-described frequency comparison process for the up-spread which regulates a lower limit frequency of spread spectrum, communication can be realized.

Moreover, by having the frequency generator 43 receive an SSC selection signal SSS, if the received signal RS is performing spread spectrum, it is possible to make the transmitting signal TS do the same. That is, according to this embodiment, the mode of the device 1 can be switched, depending on the transmission mode of the host 2.

The frequency generator 43 to which the frequency coordination signal FCS is inputted changes the number of frequency division by the frequency coordination signal FCS to change the frequency of the transmitting signal TS, and outputs the transmitting signal TS with a changed frequency. The transmitting signal TS with a changed frequency is then inputted to the frequency difference detector 42, and its frequency is compared again with the frequency of the received signal RS. This operation is repeated until a comparison result falls within a certain allowable range. When the comparison results falls within the certain allowable range, the frequency coordination signal FCS outputs the same value continuously. The allowable ranges of the frequency coordination of the received signal RS and the transmitting signal TS are set by the transmission signal automatic coordination transmitting/receiving device of this embodiment in a manner that the host 2 can recognize the output signal TX from the device 1.

Upon completing the frequency coordination, the device 1 extracts a transmission data DR from the digital signal generator 44 with a transmitting signal TS, and outputs it to the host 2 as the output signal TX of the device 1.

Having received the TX, the host 2 detects the signal from the device 1 (S1905), and outputs a fixed pattern signal to the device 1 as RX (S1906).

Upon receiving the fixed pattern signal as the RX, the device 1 receives the fixed pattern signal through its synchronization establishment unit 11 (S1907), and outputs a received signal RS and a synchronization establishment signal SCS. At this time, a frequency difference between the received signal RS and the transmitting signal TS should fall within an allowable range in order to establish communication. The transmitting signal TS is inputted to the digital signal generator 44 and the transmission data DR is extracted. The output signal TX of the device 1 is outputted to the host 2 as communication data (S1908).

Having received the communication data TX, the host 2 detects a signal (S1909) and transmits its communication data as RX to the device 1 (S1910). In this manner, the spread spectrum mode is enabled and bidirectional communication between the host 2 and the device 1 is realized.

An example of the operation of the transmitting/receiving device with an automatic coordination function of transmission signals according to Embodiment 2 will now be explained by illustrating a power-on sequence regulated under the serial ATA (advanced technology attachment) 1.0a.

Figure 20:
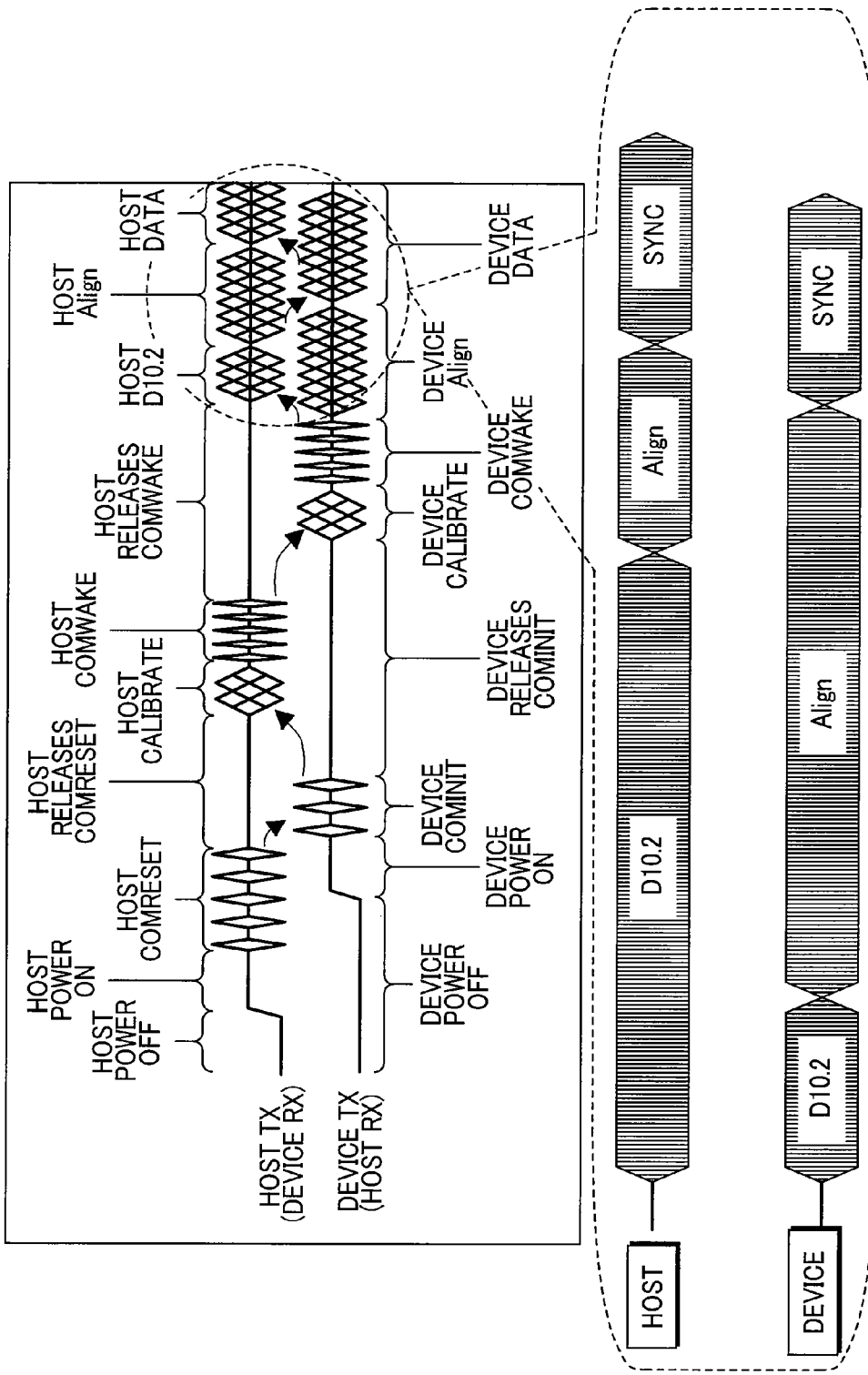
FIG. 20 is a power on sequence of serial ATA 1.0a for explaining the operation of Embodiment 2 shown in FIG. 13.

FIG. 20 shows a power-on sequence regulated in the serial ATA1.0a. A host and a device recognize each other by outputting wake signals (COMRESET, COMINIT, COMWAKE). When both recognize each other, power-on sequence proceeds, and transits to the status D10.2. The status transition after D10.2 is explained below referring to an enlarged view.

(1) The device is transited to D10.2, and outputs a D10.2 signal to the host;

(2) If the host can recognize the D10.2 signal outputted from the device, it is transited to D10.2 also;

(3) The host outputs a D10.2 signal to the device;

(4) If the device can recognize the D10.2 signal from the host, it is transited to Align and outputs an Align signal to the host;

(5) If the host can recognize the Align signal outputted from the device, it is transited to Align also;

(6) The host outputs an Align signal to the device;

(7) If the device can recognize the Align signal from the host, it is transited to SYNC.

(8) The device outputs a SYNC signal to the host; and (9) If the host can recognize the SYNC signal outputted from the device, it is transited to SYNC.

Here, in the status transition shown in (5), for the host to recognize the Align signal outputted from the device, the Align signal should have a frequency range of 1.5 GHz ($\pm$350 ppm) given that it is not performing spread spectrum, while 1.5 GHz (+350 ppm to −5000 ppm) given that it is performing spread spectrum. At this time, the D10.2 signal outputted from the host should have a frequency range of 1.5 GHz ($\pm$350 ppm) given that it is not performing spread spectrum, while 1.5 GHz (+350 ppm to −5000 ppm) given that it is performing spread spectrum.

In the transmitting/receiving device with an automatic coordination function of transmission signals according to this embodiment shown in FIG. 13, even though the frequency of the Align signal the device itself outputs in the beginning is in a range that cannot be recognized by the host, if it is not performing spread spectrum using the D10.2 signal outputted from the host, it can coordinate the frequency to 1.5 GHz ($\pm$350 ppm), while 1.5 GHz (+350 ppm to −5000 ppm) if it is performing spread spectrum.

Figure 21:
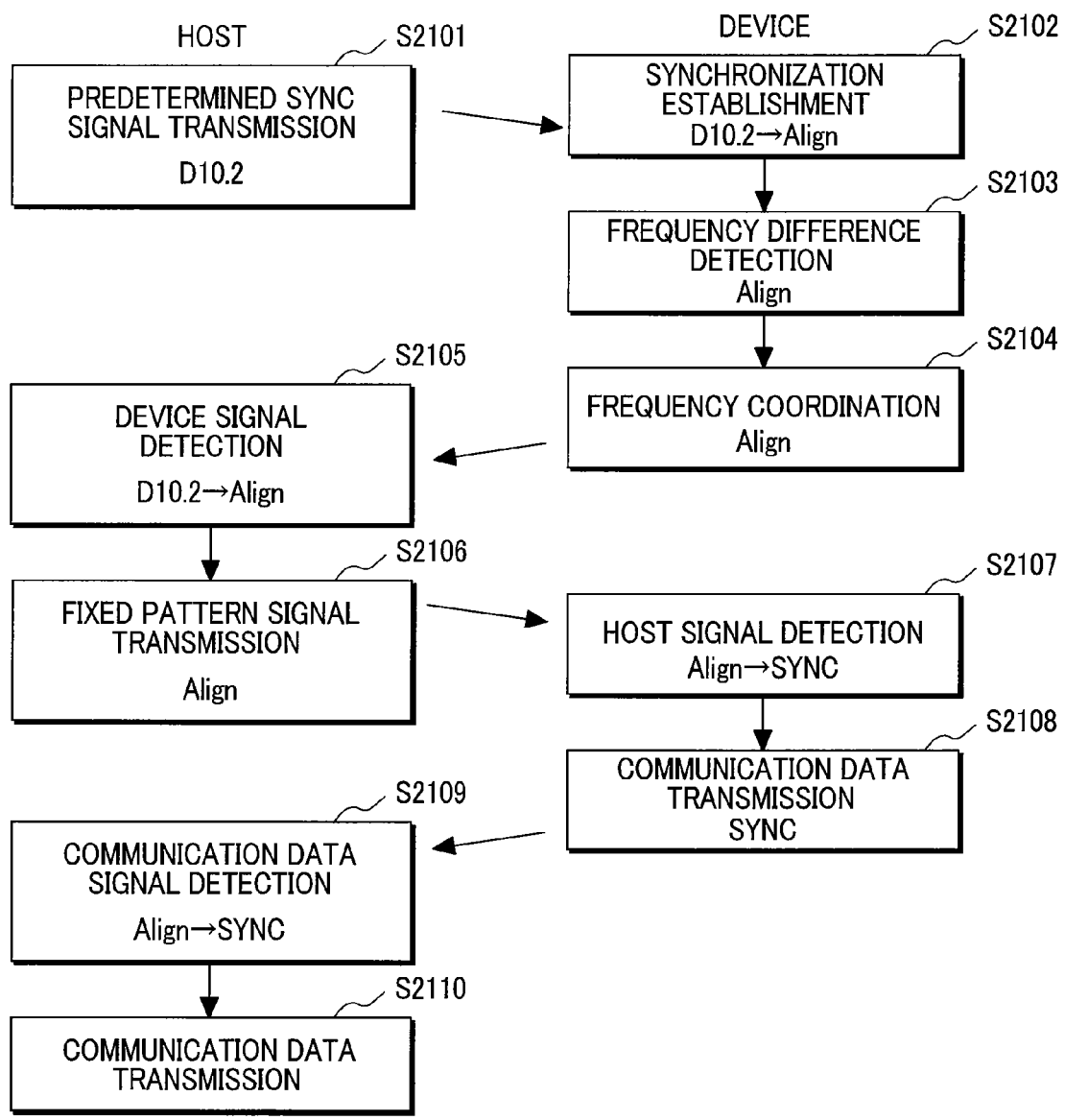
FIG. 21 is a detailed power on sequence for explaining the operation of serial ATA 1.0a in the power on sequence in Embodiment 2 shown in FIG. 13.

Referring to FIGS. 20, 21, and 13, the following will now describe the status transition of the host and the device provided that both of them are performing spread spectrum.

FIG. 21 describes a sequence after D10.2 (an enlarged portion in FIG. 20) when the transmitting/receiving device with an automatic coordination function of transmission signals according to this embodiment shown in FIG. 13 operates in power on sequence regulated in the serial ATA (advanced technology attachment) 1.0a.

As shown in FIG. 21, when the host 2 transits to D10.2, it outputs a predetermined sync signal (D10.2 signal) to the device 1 (S2101). Having received the predetermined sync signal (D10.2 signal), the synchronization establishment unit 11 in the device 1 extracts a clock and data from the sync signal (D10.2 signal) and outputs a received signal RS and a synchronization establishment signal SCS, respectively (S2102). In the frequency difference detector 42, the signal detector 421 which received the synchronization establishment signal (SCS) confirms the predetermined sync signal (D10.2 signal) and when it is recognized, outputs to the sequencer 422 a detection result telling that it could recognize the signal. The sequencer 422 informs the detection results telling that the D10.2 was recognizable, transits the status of the device from D10.2 to Align for its synchronization establishment, and outputs a sequence signal SQS informing the frequency difference detection coordinator 423 of the initiation of frequency difference detection (S2103).

In Align status, a transmitting signal TS of the device should have a frequency accuracy in a range of 1.5 GHz (+350 ppm to −5000 ppm). Accordingly, frequency coordination is carried out in Align status (S2104).

First, an RX signal outputted from the host has a frequency range of 1.5 GHz-1.4925 GHz. Meanwhile, the device has Fref=20 MHz and the number of frequency division, N, of the frequency generator 43 is N=80+(0 to −0.375). Here, the frequency generator 43 is a fractional frequency division type PLL which makes the transmitting signal TS perform spread spectrum by changing the number of frequency division N. The frequency of the transmitting signal TS is now in a range of 1.6 GHz-1.5925 GHz. At this time, the upper limit frequency, the average frequency AF and the lower limit frequency DF of the received signal RS are UF=1.5 GHz, AF=1.49625 GHz, and DF=1.4925 GHz, respectively. On the other hand, the upper limit frequency, the average frequency AF and the lower limit frequency DF of the transmitting signal TS are UF=1.6 GHz, AF=1.59625 GHz, and DF=1.5925 GHz, respectively. The frequency difference between the average frequency AF of the received signal RS and the average frequency AF of the transmitting signal TS is 0.1 GHz.

The difference detector 4233 has a table for example, determines from the table a frequency coordination signal FCS when the frequency difference is 0.1 GHz, and outputs the determined signal. Besides using the table, the difference detector 4233 may apply other diverse methods for determining the frequency coordination signal FCS. Here, it is assumed that −5 is outputted as the frequency coordination signal FCS when a frequency difference is 0.1 GHz. Since the frequency coordination signal FCS is added to the number of frequency division N, the frequency generator 43 takes the number of frequency division N after the addition N=75+(0 to −0.375). A frequency of the transmitting signal TS now falls within a range of 1.5 GHz-1.4925 GHz and thus, the frequency coordination is completed.

Having received a TX signal, the transmitting signal of the device, the host is capable of recognizing the Align signal of the device at a point when the frequency of the TX signal ranges from 1.5 GHz to 1.4925 GHz (S2105). If the signal was recognized, the host transits to Align from D10.2 and transmits a fixed pattern signal (Align signal) as an RX signal to the device (S2106).

Having received the fixed pattern signal (Align signal), the synchronization establishment unit 11 in the device 1 extracts a clock and data from the fixed pattern signal (Align signal) and outputs a received signal RS and a synchronization establishment signal SCS, respectively. In the frequency difference detector 42, the signal detector 421 which received the synchronization establishment signal (SCS) confirms the fixed pattern signal (Align signal) and when it is recognized, outputs to the sequencer 422 a detection result telling that it could recognize the signal. The sequencer 422 informs the detection results telling that the fixed pattern signal (Align signal) was recognizable, transits the status of the device from Align to SYNC for its successful synchronization establishment (S2107), and outputs a sequence signal SQS informing the frequency difference detection coordinator 423 of the initiation of frequency difference detection. By the sequence signal SQS, the frequency difference detection coordinator 423 may or may not stop the frequency comparison process between the received signal RS and the transmitting signal TS.

The device 1 being transited to the SYNC status outputs a communication data (SYNC signal) as a TX signal (S2108).

If the host 2 can recognize the communication data (SYNC signal), it transits to SYNC from Align (S2109), and outputs a communication data (SYNC signal) (S2110).

Similar to Embodiment 1, Embodiment 2 does not always require a high-price oscillator, e.g., a crystal oscillator, but a low-price oscillator, e.g., a ceramic oscillator, can be mounted on the board becomes possible, and this leads to cost reduction of the transmitting/receiving device with an automatic coordination function of transmission signals.

In addition, it is possible to provide a low-price semiconductor IC device, in which the output from the frequency generator of the device is not under the influence of noises included in the transmitting/received signal, and which is excellent in adaptability and capable of bidirectional communication facilitating the accommodation to high-speed transmission with a strict noise specification.

Moreover, according to Embodiment 2, the communication between the host and the device is readily adaptive to the spread-spectrum mode. As a result, it is possible to realize a transmitting/receiving device with an automatic coordination function of transmission signals capable of reducing unnecessary radiation (EMI) generated from the device.

Embodiment 3

Figure 22:
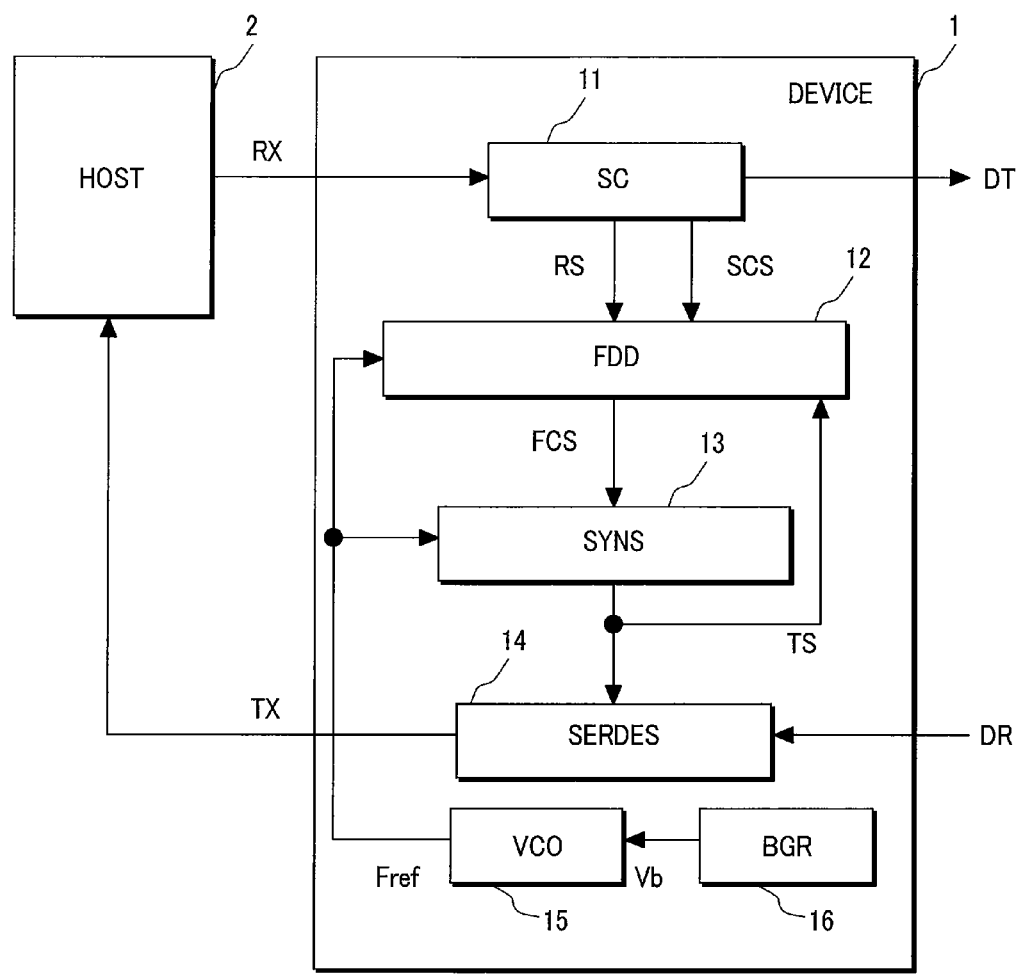
FIG. 22 is a block diagram for explaining a modification of Embodiment 1 shown in FIG. 1.

Next, a transmitting/receiving device with an automatic coordination function for transmission according to a third embodiment will be explained with reference to FIG. 22.

Embodiment 3 is a modification of Embodiment 1. That is, although Embodiment 1 utilized the oscillator 3 as a reference signal generation source, Embodiment 3 utilizes a VCO 15 and a reference voltage generation circuit (BGR) instead of the oscillator to generate a reference signal. By mounting the VCO 15 capable of generating a frequency controlled output signal with a control voltage VB generated by the BGR 16 inside the device 1, it becomes possible to generate a reference signal Fref inside the device 1. This can also be introduced as a modification of Embodiment 2. The transmitting/receiving device (not shown) of the host 2 is configured to operate based on a high-accuracy reference signal generated by a crystal oscillator for example.

For a configuration of the BGR 16 used in this embodiment, the circuit that is disclosed in "CMOS Circuit Design, Layout, and Simulation" by R. J. Baker, et al., (IEEE Press, p 480) can be used.

Since the operation of Embodiment 3 is same as the operation of Embodiment 1, except that a reference signal is generated by means of the VCO 15 and the BGR 16 instead of the oscillator, its explanation will not be provided.

Embodiment 4

Figure 23:
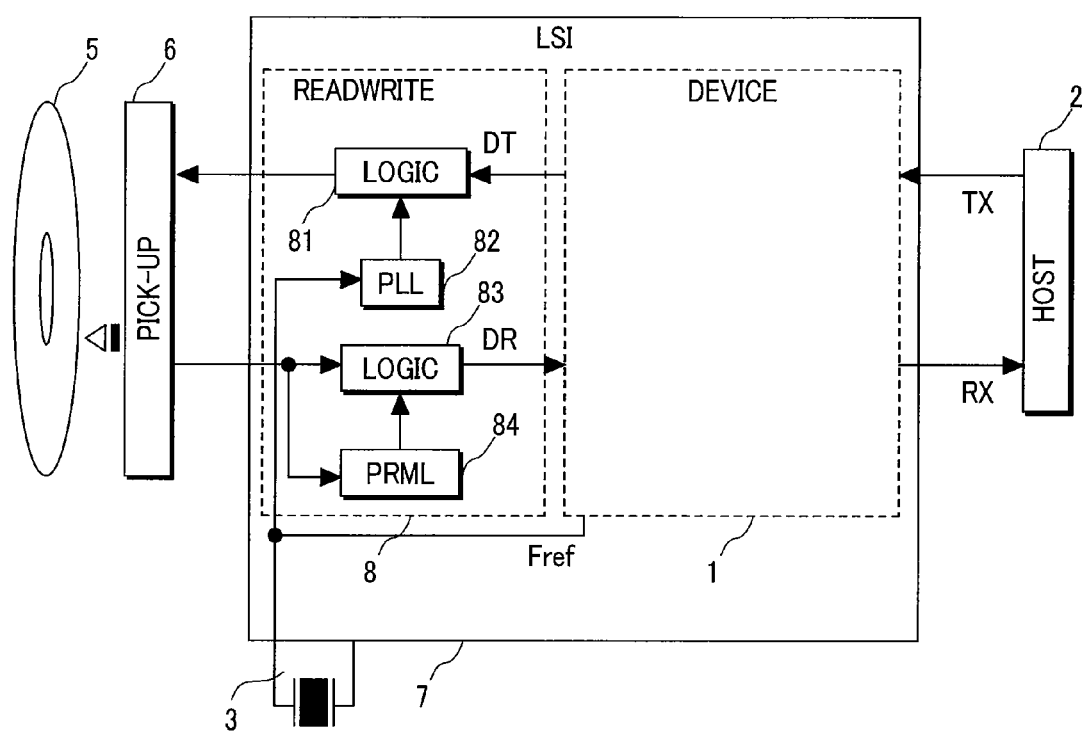
FIG. 23 is a block diagram for explaining an example of an interface device to which a transmitting/receiving device with an automatic coordination function of transmission signals according to the present invention is applied.
Figure 24:
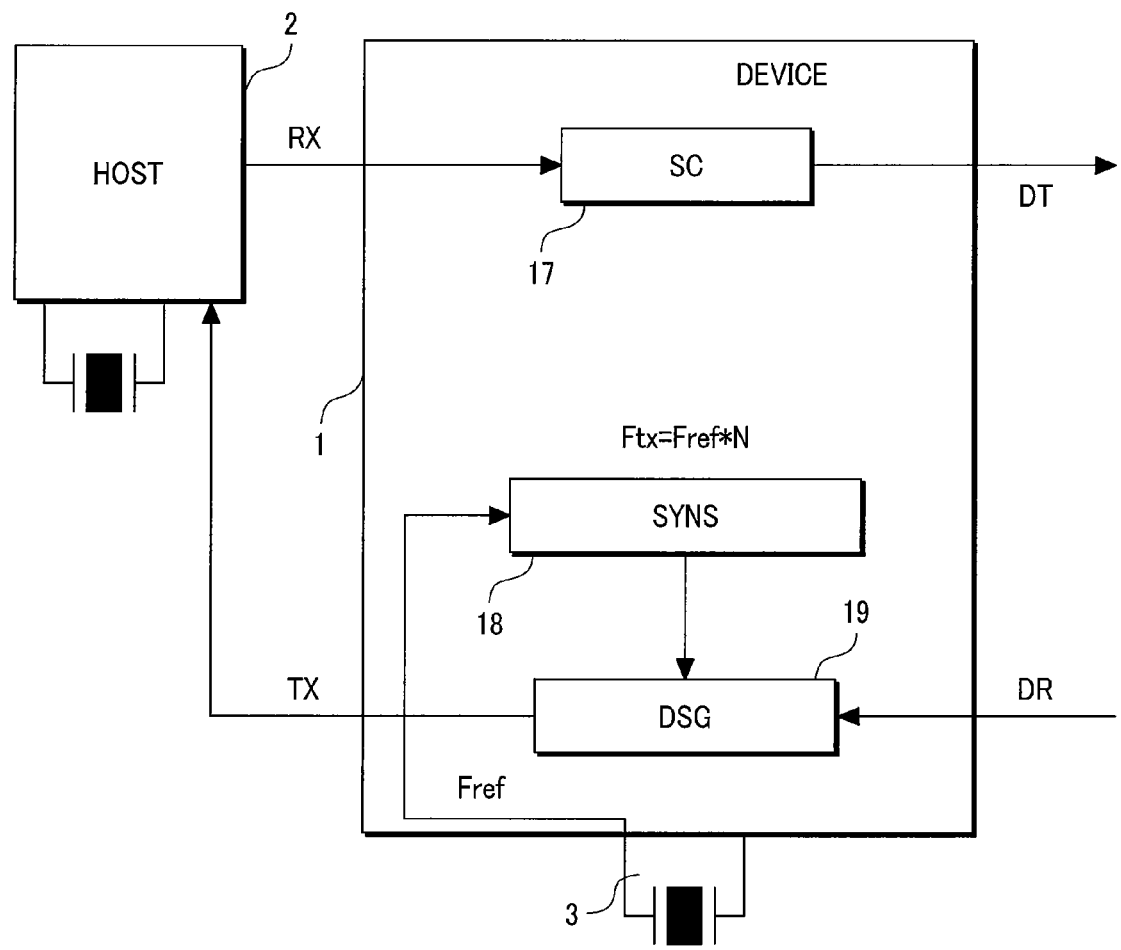
FIG. 24 is a block diagram for explaining a conventional transmitting/receiving device with an automatic coordination function of transmission signals.

Next, a transmitting/receiving device according to a fourth embodiment of the present invention will now be explained referring to FIG. 23. Embodiment 4 is an example of a communication system using an interface device having an automatic coordination function of transmission signals described in Embodiment 1, Embodiment 2, and Embodiment 3.

The communication system includes a host 2, a semiconductor IC device 7 forming an interface device, a pickup 6, a media 5, and an oscillator 3. In case that Embodiment 3 is applied, the oscillator 3 is not required. A transmitting/receiving device (not shown) of the host 2 is built to operate based on a high-accuracy reference signal generated by a crystal oscillator for example.

The semiconductor IC device 7 includes a device 1 and a recording/reproducing unit 8 such as a DVD and the like. For the device 1, the device introduced in Embodiment 1, Embodiment 2 or Embodiment 3 can be utilized.

The recording/reproducing unit 8 consists of a recording logic circuit 81, a PLL 82, a reproducing logic circuit 83, and a signal processing circuit 84.

A communication data TX transmitted from the host 2 is inputted to the device 1, and is inputted to the recording/reproducing unit 8 as a data DT. The data DT inputted to the recording/reproducing unit 8 is processed by the recording logic circuit 81 which is operated in response to a clock signal generated by the PLL 82, is outputted to the pickup 6 as a recording data, and is recorded in the media 5.

Meanwhile, a readout data being read out of the media 5 is inputted to the recording/reproducing unit 8 through the pickup 6. The readout data is processed in the signal processing circuit 84 and the reproducing logic circuit 83, and is outputted as a data DR to the device 1. The device 1 transmits the data DR as a transmitting signal RX to the host 2, thereby realizing bidirectional communication between the host 2 and the device 1. By applying the transmitting/receiving device with an automatic coordination function of transmission signals introduced in Embodiment 1 or Embodiment 2 to the interface device as the device 1, an inexpensive oscillator is used for the oscillator 3. In addition, by applying the transmitting/receiving device with a certain function described in Embodiment 3 to the interface device, it becomes possible to realize a transmitting/receiving device capable of bidirectional communication with the host without employing an oscillator. In this manner, a low-price transmitting/receiving device can be provided.

The semiconductor IC device 7 of the present invention has a wide range of applications of a device performing bidirectional communication with a host, such as, an interface device between a host in a navigation system of an automobile and a system mounted on the automobile.

According to the respective embodiments, the frequency of the reference signal generation source of the device is deviated due to manufacturing deviation, temperature change, and a change in elapsed time, and even if the deviation range of the frequency exceeds a guarantee range required for establishing communication, the device is able to detect the output signal from the host, coordinate the output frequency for itself and thus, establish the communication. Consequently, it is possible to introduce to the market a semiconductor IC device using an inexpensive oscillator as a reference signal generation source and being excellent in adaptability.

Embodiment 5

Next, a communication system with an automatic coordination function of transmission signals according to a fifth embodiment of the present invention will now be explained with reference to FIGS. 25-35.

Figure 25:
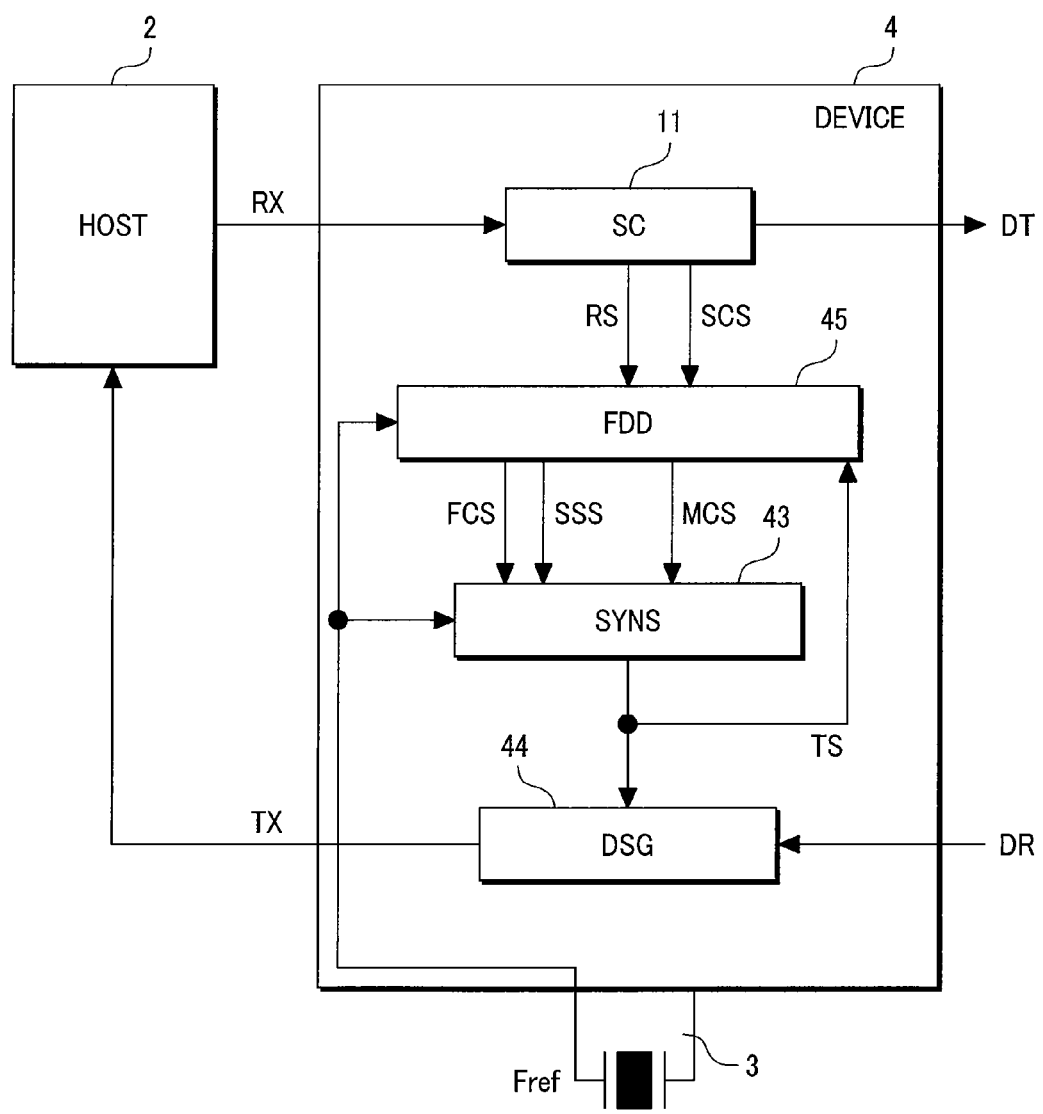
FIG. 25 is a block diagram for explaining a transmitting/receiving device with an automatic coordination function of transmission signals according to Embodiment 5 of the present invention.

FIG. 25 is a block diagram for explaining an overall configuration of a communication system according to Embodiment 5.

The communication system in this embodiment includes a host 2 which outputs RX to a device 4 and receives TX from the device 4, the device 4 which receives RX from the host 2 and outputs a reception data DT and which receives a transmission data DR and transmits TX to the host 2, an oscillator 3 inputting a reference signal Fref to the device 4, and a transmitting/receiving device which includes a case where transmitting/receiving signal frequencies of spread spectrum (SSC) performed by serial ATA and the like are not uniform.

The device 4 includes a synchronization establishment unit 11 which is inputted the RX the device 4 received, extracts a clock and data from the RX to generate a received signal RS and a synchronization establishment signal SCS, respectively, and outputs the reception data DT; a frequency difference detector FDD 45 which is inputted the received signal RS, the synchronization establishment signal SCS, the reference signal Fref, and the transmitting signal TS, and outputs a frequency coordination signal FCS, an SSC selection signal SSS and a modulation factor coordination signal MCS by detecting a frequency difference and a modulation factor difference between the received signal RS and the transmitting signal TS; a frequency generator SYNS 43 which is inputted the frequency coordination signal FCS, the SSC selection signal SSS, the modulation factor coordination signal MCS and the reference signal Fref, and outputs the transmitting signal TS of which spread spectrum SSC is determined by the SSC selection signal SSS, of which modulation factor is determined by the modulation factor coordination signal MCS, and of which frequency is determined based on the frequency coordination signal FCS and the reference signal Fref; and a digital signal generator DSG 44 which is inputted the transmitting signal TS and the transmission data DR, and outputs the TX.

The device of Embodiment 5 is characterized by including a synchronization control unit which consists of the synchronization establishment unit 11 and the frequency difference detector 45, and the frequency generator 43.

Figure 26:
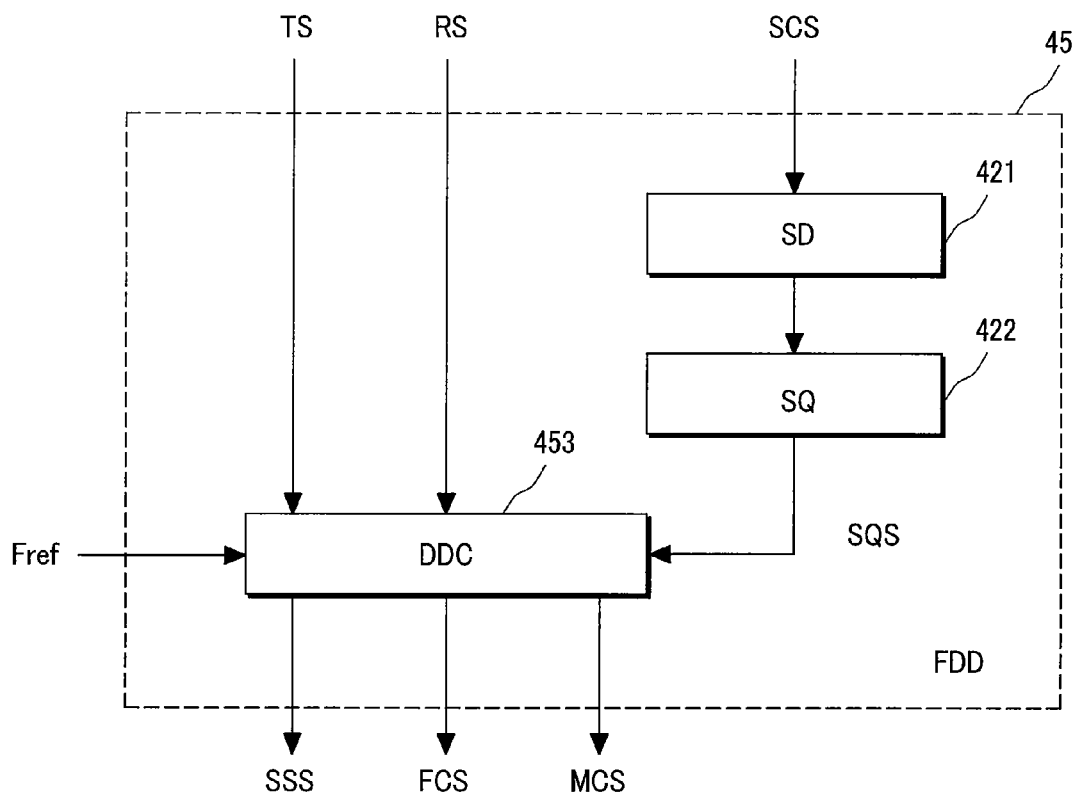
FIG. 26 is a block diagram for explaining an example of a configuration a frequency difference detector used in the transmitting/receiving device with an automatic coordination function of transmission signals in FIG. 25.

FIG. 26 shows an example of a configuration of the frequency difference detector 45 in the device according to Embodiment 5. The frequency difference detector 45 includes a signal detector 421, a sequencer 422, and a frequency difference detection coordinator 453. The signal detector 421 detects data based on a synchronous establishment signal SCS being inputted, and outputs a detection result to the sequencer 422. The sequencer 422 to which the detection result is inputted outputs a sequence signal SQS for informing a frequency difference detection sequence to the frequency difference detection coordinator 453.

The frequency difference detection coordinator 453 compares an upper limit frequency UF of the received signal RS and an lower limit frequency DF of the received signal RS to judge whether spread spectrum is being performed, and outputs the judgment result as an SSC selection signal SSS.

In addition, the frequency difference detection coordinator 453 detects a frequency difference between the received signal RS and the transmitting signal TS to detect a difference in spread spectrum modulation factor of the frequency coordination signal FCS, the received signal RS and the transmitting signal TS from the detection result, and outputs it as a modulation factor coordination signal MCS.

Figure 27:
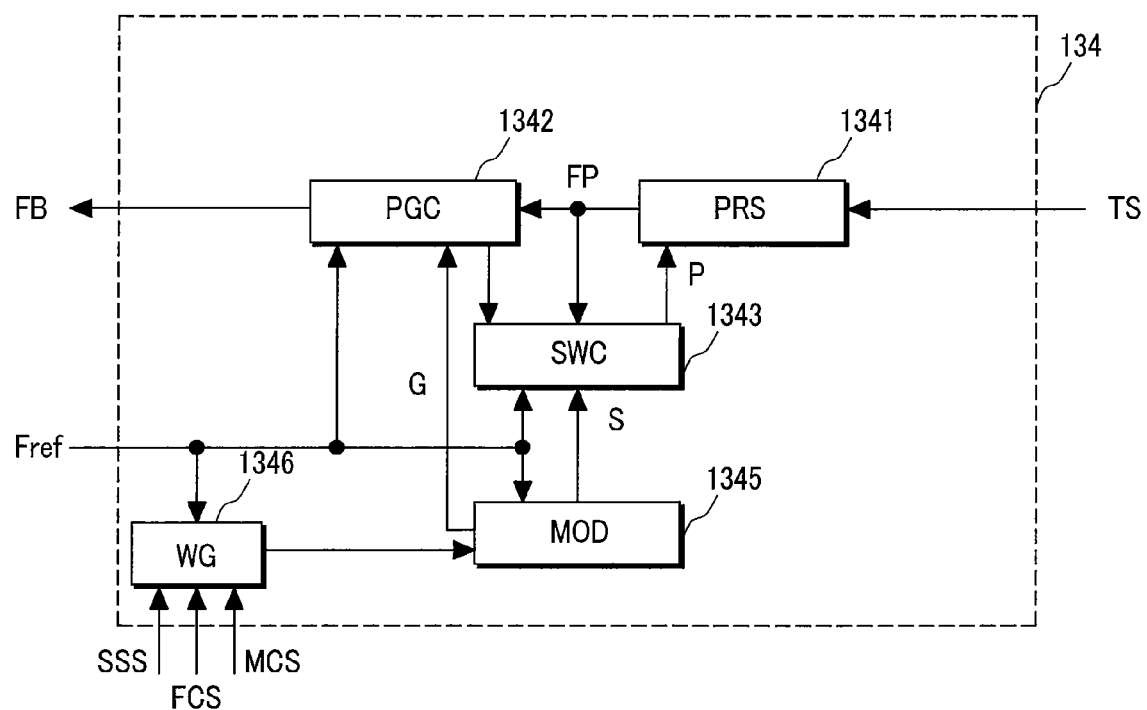
FIG. 27 is a diagram showing an example of a configuration of a variable frequency divider (1/N) of a frequency generator in Embodiment of FIG. 25.

Going back to FIG. 25, the frequency generator SYNS 43 has an almost same configuration as the frequency generator SYNS 13 shown in FIG. 6. FIG. 27 illustrates an example of a configuration of the variable frequency divider (1/N) 134 of the frequency generator SYNS 43. The frequency coordination signal FCS, the SSC selection signal SSS and the modulation factor coordination signal MCS are inputted to the waveform generating unit 1346 of the variable frequency divider (1/N) 134. The frequency generator SYNS 43 is a PLL capable of realizing a fractional frequency division. As a modulated wave such as a triangular wave is outputted from the waveform generating unit 1346 in response to the SSC selection signal SSS, it becomes possible to make the transmitting signal TS a spread-spectrum signal. Moreover, when the modulation factor coordination signal MCS is large, the modulation factor Xp in the device is increased. On the other hand, when the modulation factor coordination signal MCS is small, the modulation factor Xp in the device is decreased.

As such, in the power-on sequence in this embodiment, in the case that the SSC modulation factor Xp of the device and the SSC modulation factor Xc of the host are not uniform, the SSC modulation factor Xp of the device is changed or matched corresponding to the SSC modulation factor Xc of the host by the modulation factor coordination signal MCS, and then transmits the signal.

Figure 28A:
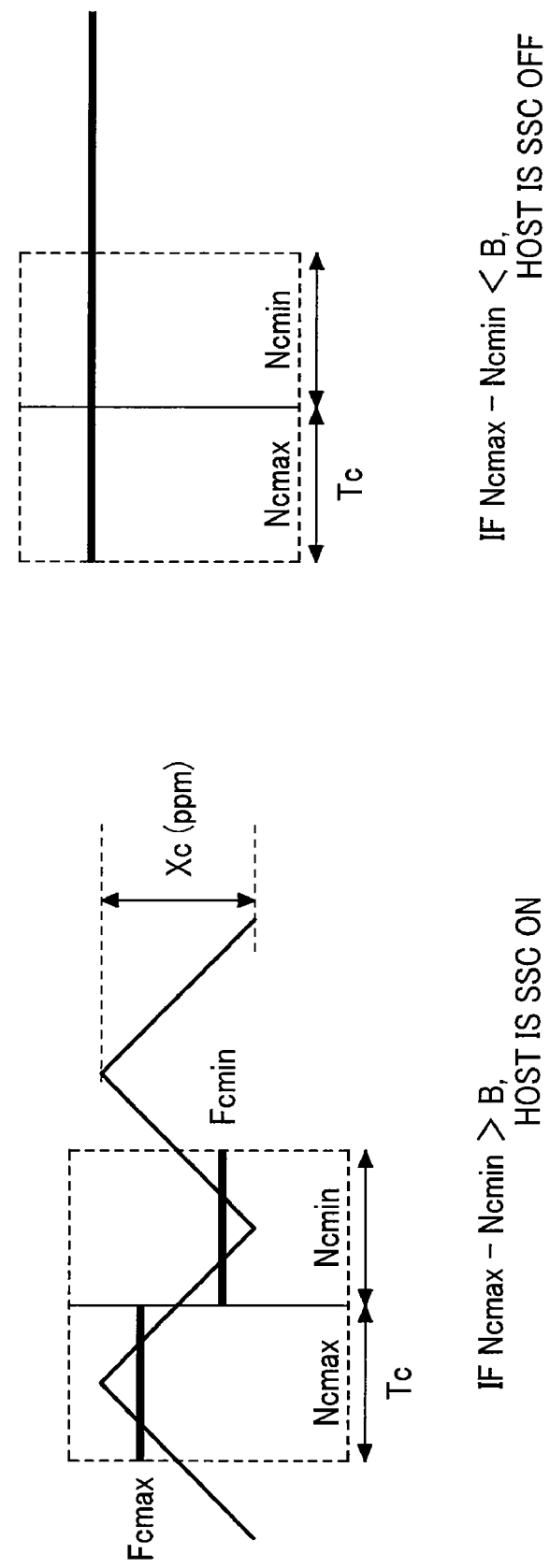
FIG. 28A is a diagram for explaining a concept of a spread spectrum (SSC) mode of a HOST signal in Embodiment of FIG. 25.
Figure 28B:
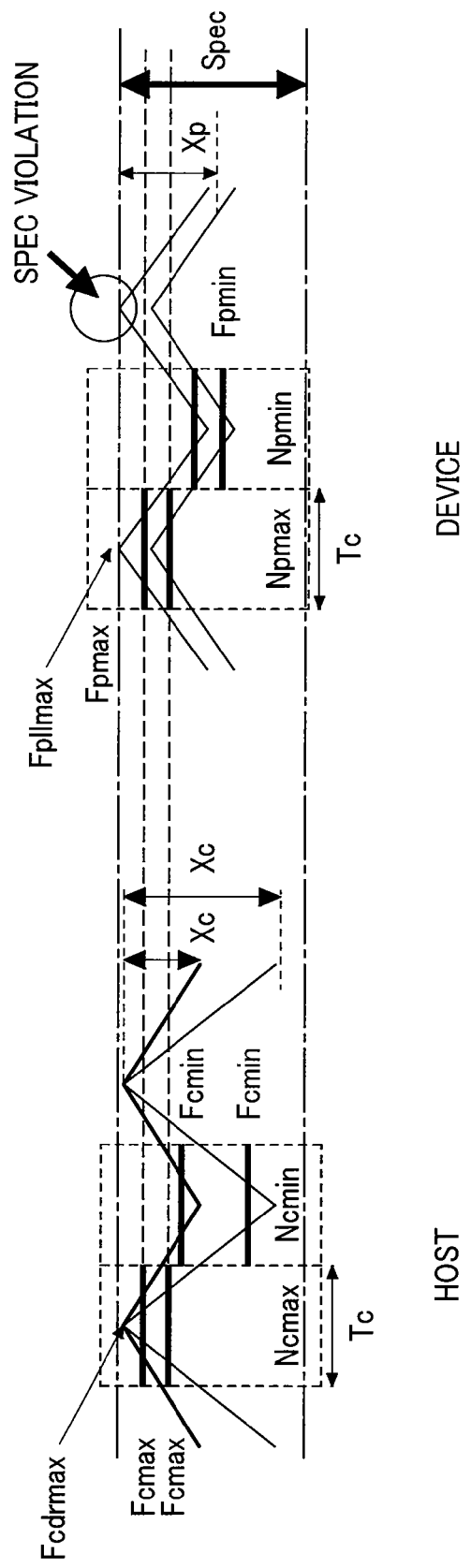
FIG. 28B is a diagram for explaining a concept of a modulation factor coordination process in Embodiment of FIG. 25.

Next, FIG. 28A explains the spread spectrum (SSC) mode detection process by the HOST signal, and FIG. 28B explains a concept of the modulation factor coordination process.

FIG. 28A illustrates a relation between upper limit and lower limit frequencies UF and DF which are output signals from a received frequency detector and the SSC modulation factor Xc of the host. In the spread spectrum (SSC) mode detection process by the HOST signal, if a difference between a maximum Mcmax (=UF) and a minimum value Ncmin (=DF) of the count value of frequency Nc is greater than a predetermined value B, it is detected that the HOST signal is in the spread spectrum (SSC) mode. On the contrary, if a difference between Ncmax and Ncmin is less than the predetermined value B, it is detected that the HOST signal is not in the SSC mode. The comparison time Tc at this time is determined by a reference signal Fref.

If it is judged by the sequence signal SQS that the signal is of a frequency difference detection sequence, the modulation factor coordination process shown in FIG. 28B is carried out to find out a relation between the SSC modulation factor (Xc) of the host and the SSC modulation factor (Xp) of the device, and a comparison is made between the upper limit frequencies UF (Fcmax, Fpmax) and the lower limit frequencies DF (Fcmin, Fpmin) of the received signal RS and the transmitting signal TS and the upper limit and lower limit frequencies of the spec, respectively. In the case that the comparison result (T–R) exceeds an allowable range, a frequency coordination signal FCS is outputted and the SSC modulation factor Xp in the device is increased, thereby making it fall within the allowable range. On the other hand, if it is judged by the sequence signal SQS that the signal is of a frequency difference detection sequence, the frequency comparison between the received signal RS and the transmitting signal TS is not performed.

Figure 36A:
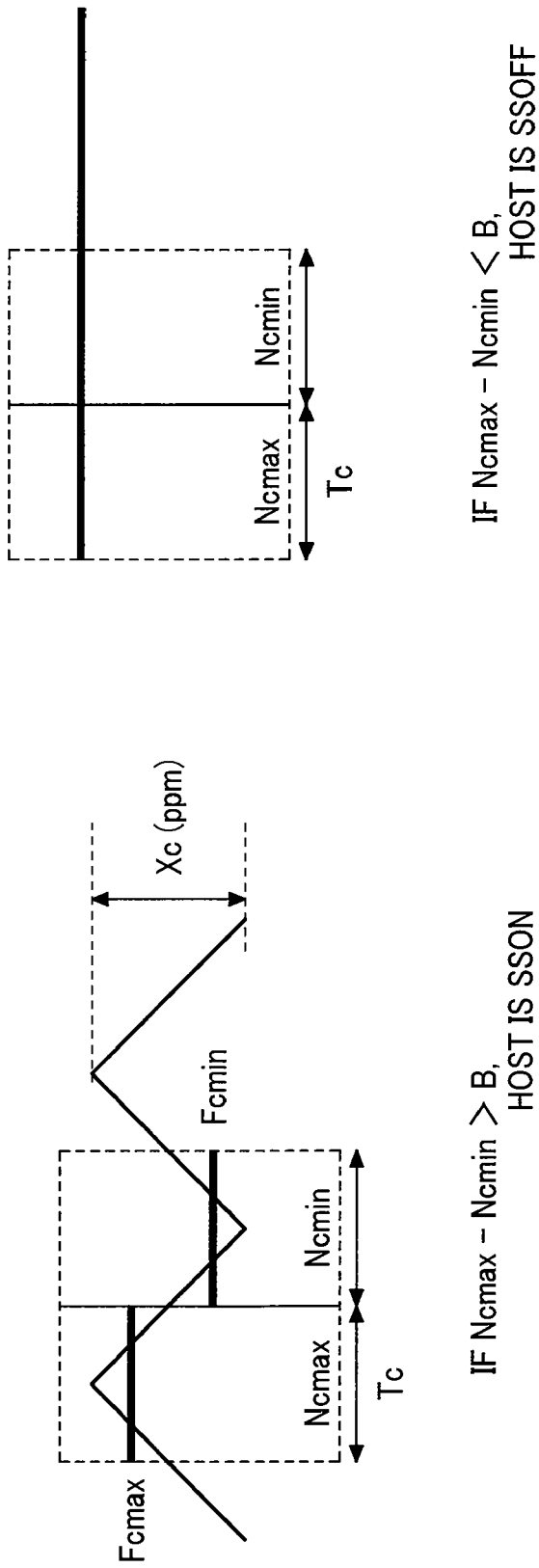
FIG. 36A is a diagram for explaining a concept of a spread spectrum (SSC) mode detection process by a HOST signal, in accordance with a conventional technique.
Figure 36B:
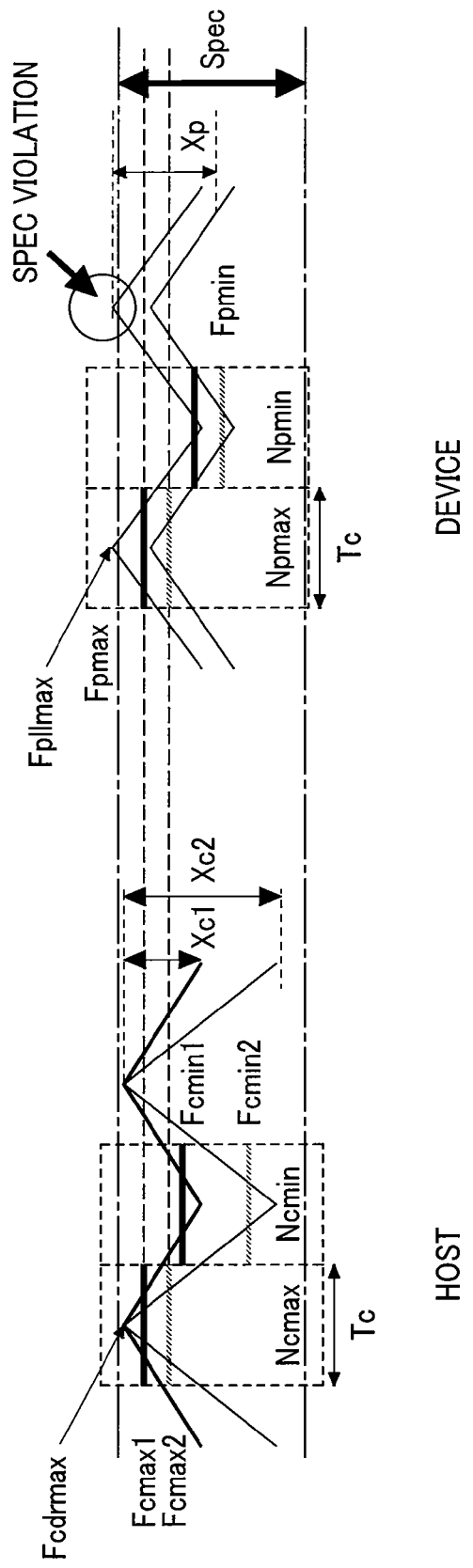
FIG. 36B is a diagram for explaining a concept of a communication process between a host and a device in a conventional transmitting/receiving device with an automatic coordination function of transmission signals.

Here, for comparison with this embodiment, FIG. 36 (FIGS. 36A and 36B) explain a concept of a spread spectrum (SSC) mode detection process by a HOST signal and a communication process between a host and a device, in accordance with a conventional technique.

In the conventional technique, as shown in FIG. 36A, the spread spectrum (SSC) mode detection process by a HOST signal detects whether the HOST signal is in the SSC mode by checking whether a difference between a maximum value Ncmax and a minimum value Ncmin of the count value of frequency Nc is greater than a predetermined value B. However, in the conventional technique, even though the HOST signal is in the SSC mode, the SSC modulation factor (Xp) coordination of the device is not performed. Meanwhile, the SSC modulation factor (Xc) of the host is not unified but has diverse specs per product on the market. On the other hand, in the case of a certain product, the SSC modulation factor (Xp) of its device is fixed. As a result, as shown in FIG. 36B, the SSC modulation factor (Xp) of the device performing mutual communication by the SSC modulation factor (Xc1, Xc2) of the host may exceed the range of the spec and end up with spec violation.

In this embodiment of the present invention, if it is judged by a sequence signal SQS that the signal is of a frequency difference detection sequence, the modulation factor coordination process is carried out to detect whether the spec corresponds. If the spec does not correspond, the SSC modulation factor (Xp) of the device is matched with the SSC modulation factor (Xc) of the host so no such defect occurs.

Moreover, in this embodiment, if it is judged by a sequence signal SQS that the signal is of a frequency difference detection sequence and if the sequence is a sequence like the power on sequence used for establishing communication, the modulation factor coordination signal MCS may be set small with respect to the communication spec in order to set a priority to communication establishment. For instance, although a maximum SSC modulation factor (Xp) of a communication signal in the serial ATA is 5000 ppm, the SSC modulation factor (Xp) in a power on sequence is deliberately set as small as 3000 ppm to make sure the communication establishment.

Figure 29:
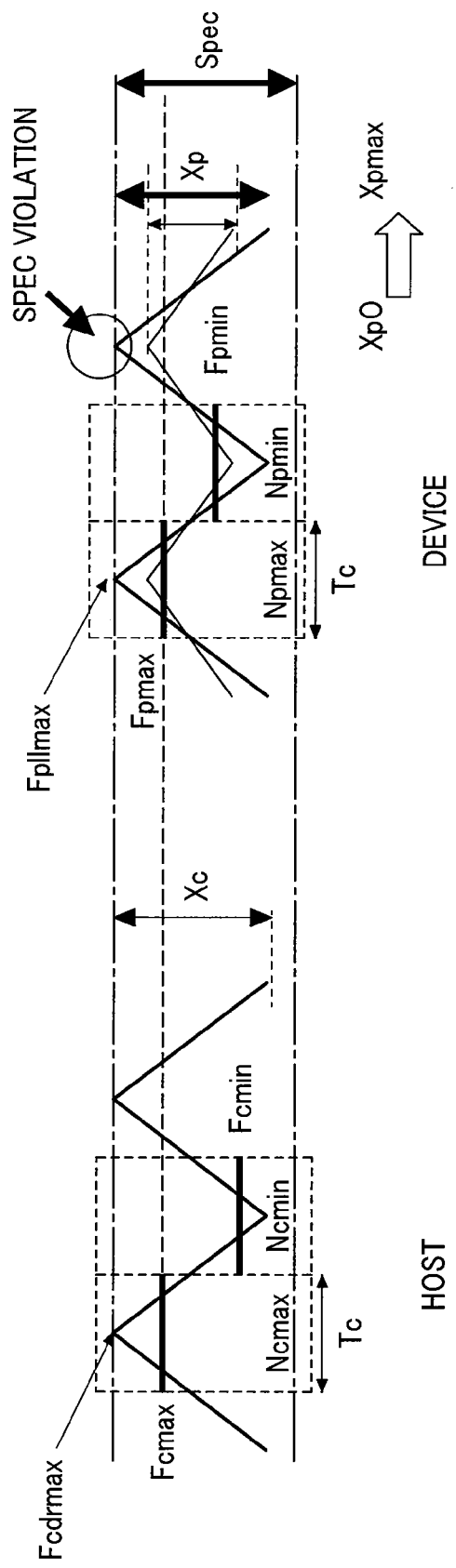
FIG. 29 is a diagram showing another example of a modulation factor coordination process in Embodiment of FIG. 25.

FIG. 29 illustrates another example of the modulation factor coordination process. That is, in the case that it is judged by a sequence signal SQS that the signal is of a frequency difference detection sequence and if the sequence is a sequence after communication is established, in order to gradually increase the modulation factor (Xp) set small on purpose in the power on sequence while the communication is being established, as shown in FIG. 29, the SSC modulation factor (Xp) of the device is gradually increased according to routine during the communication, the upper limit frequency UF and lower limit frequency DF of the received signal RS and of the transmitting signal TS may be detected and increased to their maximums within the spec range. For instance, in the serial ATA, in the initial power on sequence as described above, the SSC modulation (Xp0) of a transmitting signal is set to 3000 ppm to establish communication, and then the modulation factor (=Xpmax) is gradually increased as high as 5000 ppm within the spec.

Figure 30:
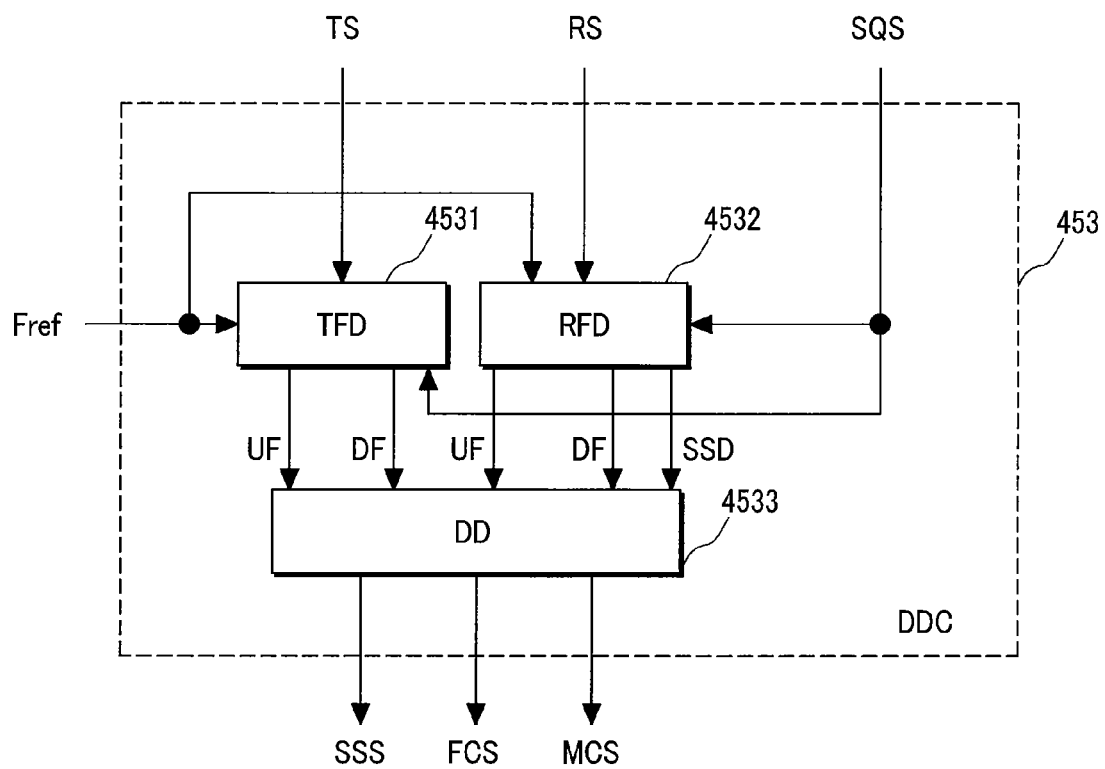
FIG. 30 is a block diagram for explaining an example of a configuration of a frequency difference detection coordinator used in the frequency difference detector in FIG. 26.

Next, FIG. 30 illustrates an example of a configuration of the frequency difference detector coordinator 453 according to this embodiment. The frequency difference detection coordinator 453 includes a transmitting signal frequency detector TFD 4531, a receiving signal frequency detector RFD 4532, and a difference detection circuit DD 4533. If it is judged by a sequence signal SQS that a signal is of a frequency difference detection sequence, the transmitting signal frequency detector TFD 4531 and the receiving signal frequency detector RFD 4532 count pulse of the transmitting signal TS and of the received signal RS, respectively, and an upper limit frequency UF and a lower limit frequency DF of each are detected. The count time in this case is determined by a reference signal Fref. In addition, the received signal frequency detector RFD 4532 detects the SSC mode of the received signal RS and outputs it as an SSC mode decision signal SSD to the difference detection circuit DD 4533.

The difference detection circuit DD 4533 to which the upper limit frequency UF, the lower limit frequency DF, and the SSC mode decision signal SSD are inputted outputs the SSC mode decision signal SSD as an SSC selection signal SSS. Moreover, the DD 4533 compares the upper limit frequency of the transmitting signal TS and the upper limit frequency of the received signal RS, and outputs a comparison result as a frequency coordination signal FCS. In addition, the DD 4533 compares a difference between the upper limit frequency and the lower limit frequency of the transmitting signal TS, namely, the modulation factor of the transmitting signal, and a difference between the upper limit frequency and the lower limit frequency of the received signal RS, namely, the modulation of the received signal, and outputs a comparison result as a modulation factor coordination signal MCS.

Figure 31:
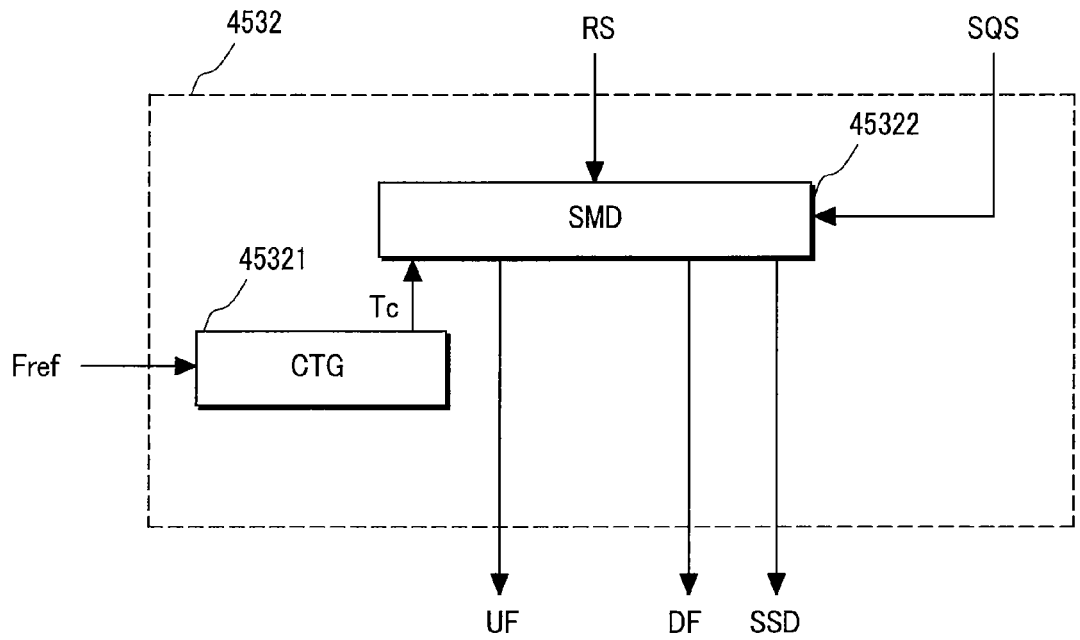
FIG. 31 is a block diagram for explaining an example of a configuration of a received frequency detector used in the frequency difference detection coordinator in FIG. 30.

FIG. 31 shows an example of a configuration of the received signal frequency detector RFD 4532. The received signal frequency detector RFD 4532 includes a counting time generator 42321 and an SSC mode detector 45322. The counting time generator 42321 receives a reference signal Fref, generates a counting time Tc and outputs it to the SSC mode detector 45322. The counting time Tc may be generated by dividing the reference signal Fref. The SSC mode detector 45322 to which the sequence signal SQS, the received signal RS, and the counting time Tc are inputted outputs an upper limit frequency UF, a lower limit frequency DF, and an SSC mode decision signal SSD.

Figure 32:
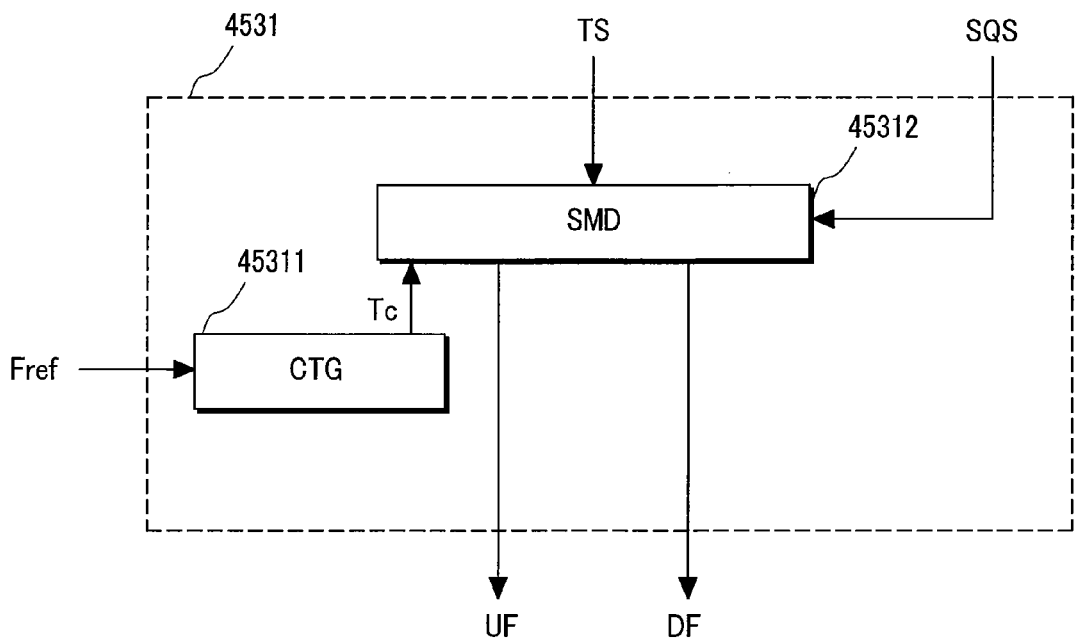
FIG. 32 is a block diagram for explaining an example of a configuration of a transmitting frequency detector used in the frequency difference detection coordinator in FIG. 30.

FIG. 32 shows an example of a configuration of the transmitting signal frequency detector TFD 4531. The transmitting signal frequency detector TFD 4531 includes a counting time generator 42311 and an SSC mode detector 45312. The counting time generator 42311 receives a reference signal Fref, generates a counting time Tc and outputs it to the SSC mode detector 45312. The counting time may be generated by dividing the reference signal F ref. The SSC mode detector 45312 to which the sequence signal SQS, the transmitting signal TS, and the counting time Tc are inputted outputs an upper limit frequency UF, a lower limit frequency DF, and an SSC mode decision signal SSD.

The configuration of the frequency generator SYNS in the device 1 of this embodiment is same as the configuration of the frequency generator SYNS 13 shown in FIG. 6. The frequency generator SYNS 43 is a PLL capable of realizing a fractional frequency division. As a modulated wave such as a triangular wave is outputted from the waveform generating unit 1346 used in a variable frequency divider 134, it becomes possible to make the transmitting signal TS a spread-spectrum signal.

Figure 33:
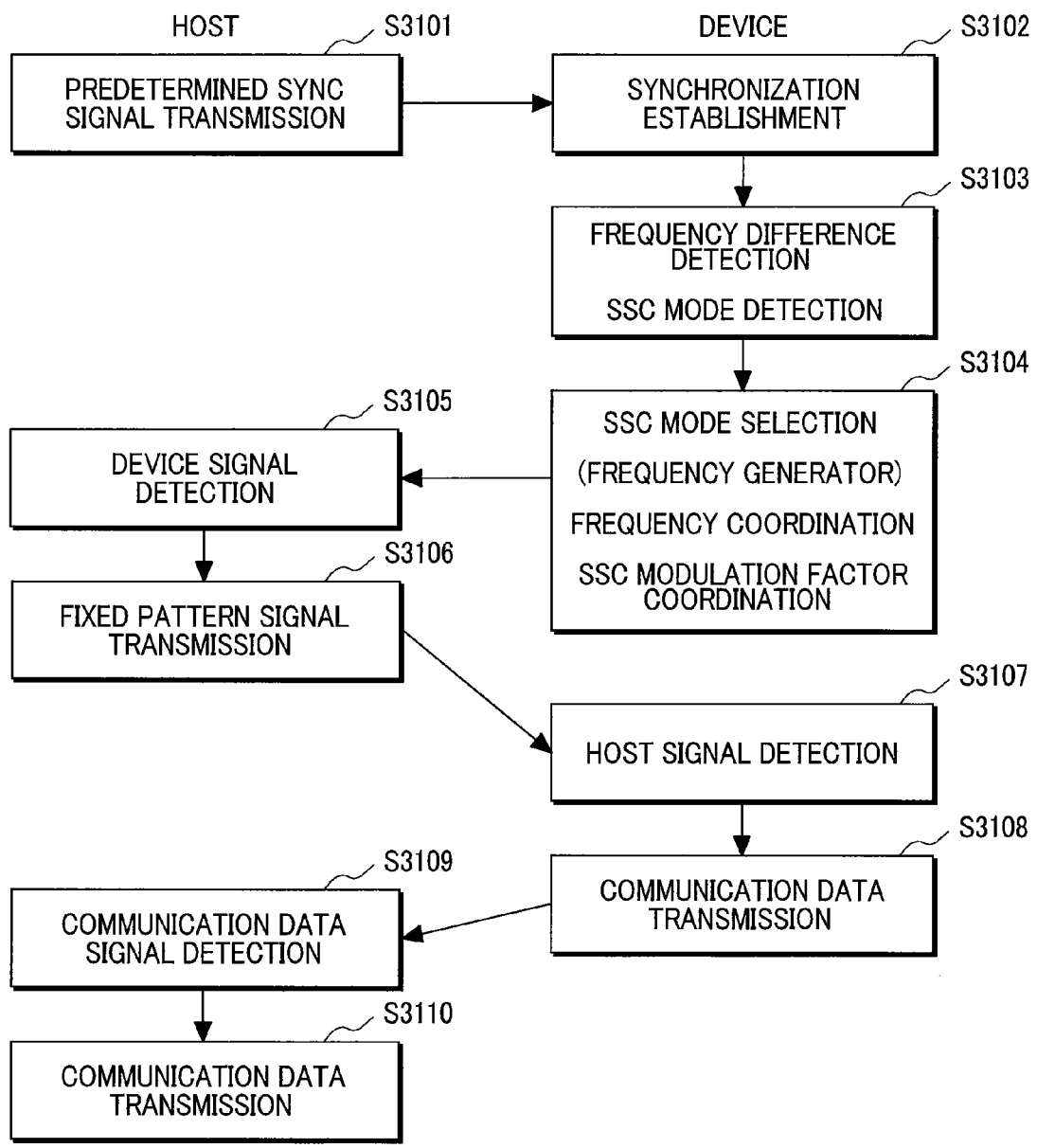
FIG. 33 is a sequence of a frequency coordination process at the time of recovery from power-on and power save modes of Embodiment 5 shown in FIG. 25.

FIG. 33 shows an example of a sequence at the time of recovery from power-on and power save modes of the transmitting/receiving device for use in the host 2 and the device 4.

A predetermined sync signal is transmitted as RX from the host 2 to a device 4 (S3101). The device 4 receives the predetermined sync signal being transmitted as RX, and its synchronization establishment unit 11 outputs a received signal RS and a synchronization establishment signal SCS (S3102). The frequency difference detector 45 to which the received signal RS and the synchronization establishment signal SCS are inputted detects an upper limit frequency UF and a lower limit frequency DF of the received signal RS; and outputs an SSC mode decision signal SSD which indicates whether spread spectrum is performed.

If the received signal RS does not perform spread spectrum, the frequency difference detector 45 detects the upper limit frequency UF and the lower limit frequency DF of the received signal RS, and outputs the SSC mode decision signal SSD indicating whether spread spectrum is performed as low. At this time, the frequency generator 43 outputs a transmitting signal TS in mode where spread spectrum is not performed. The frequency difference detector 45 to which the transmitting signal TS not performing spread spectrum as well as the received signal RS not performing spread spectrum are inputted detects the frequency of the transmitting signal TS and the frequency of the received signal RS, and outputs a frequency coordination signal FCS to the frequency generator 43 to coordinate a frequency difference (S3103).

Having received the frequency coordination signal FCS, the frequency generator 43 coordinates the frequency of the transmitting signal TS in response to the frequency coordination signal FCS and outputs the transmitting signal TS with a coordinated frequency. As such, the device 4 outputs TX coordinated to make the frequency of the transmitting signal TS fall within the communication spec to the host 2 (S3104).

On the other hand, if the received signal RS performs spread spectrum, the frequency difference detector 45 detects the upper limit frequency UF and the lower limit frequency DF of the received signal RS, and outputs the SSC mode decision signal SSD indicating whether spread spectrum is performed as High because there is a difference between the upper limit frequency UF and the lower limit frequency DF. In addition, the modulation factor coordination signal MCS is set to a value with a sufficient margin with respect to the communication spec. Accordingly, the device 4, as explained in FIG. 28B, is set to the SSC modulation factor (Xp) of the spec corresponding to the spread spectrum (SSC) mode. That is to say, the frequency generator 43 of the device 4 outputs a transmitting signal TS in mode where spread spectrum of which modulation is set by the modulation factor coordination signal MCS is performed. The frequency difference detector 45 to which the transmitting signal TS performing spread spectrum as well as the received signal RS performing spread spectrum are inputted detects the upper limit frequency UF of the transmitting signal TS and the upper limit frequency UF of the received signal RS, and outputs a frequency coordination signal FCS to the frequency generator 43 to coordinate a frequency difference in the upper limit frequencies (S3103).

Having received the frequency coordination signal FCS, the frequency generator 43 coordinates the frequency and modulation factor (Xp) of the transmitting signal TS in response to the frequency coordination signal FCS and outputs it. As such, the device 4 outputs TX coordinated to make the frequency of the transmitting signal TS fall within the communication spec to the host 2 (S3104).

Having received the TX coordinated to fall within the communication spec, the host 2 is now able to recognize the transmitted TX from the device 4 as a signal (S3105).

After recognizing the TX, the host 2 proceeds to the next sequence and transmits a fixed pattern as RX to the device 4 (S3106).

Upon receiving the fixed pattern RX, the synchronization establishment unit 11 outputs a received signal RS and a synchronization establishment signal SCS, and detects the fixed pattern (S3107). After detecting the fixed pattern, the device 4 outputs a transmission data DR as TX to the host 2 using the transmitting signal TS (S3108).

To reduce power consumption, the frequency difference detection by the frequency difference detector 45 may be stopped at this point. Having received the TX outputted from the device, the host 2 detects the transmission data DR (S3109). After detecting the transmission data DR, the host 2 transmits its transmission data as RX to the device 4 (S3110). In this manner, spread spectrum mode is enabled and bidirectional communication between the host 2 and the host 4 is realized.

Figure 34:
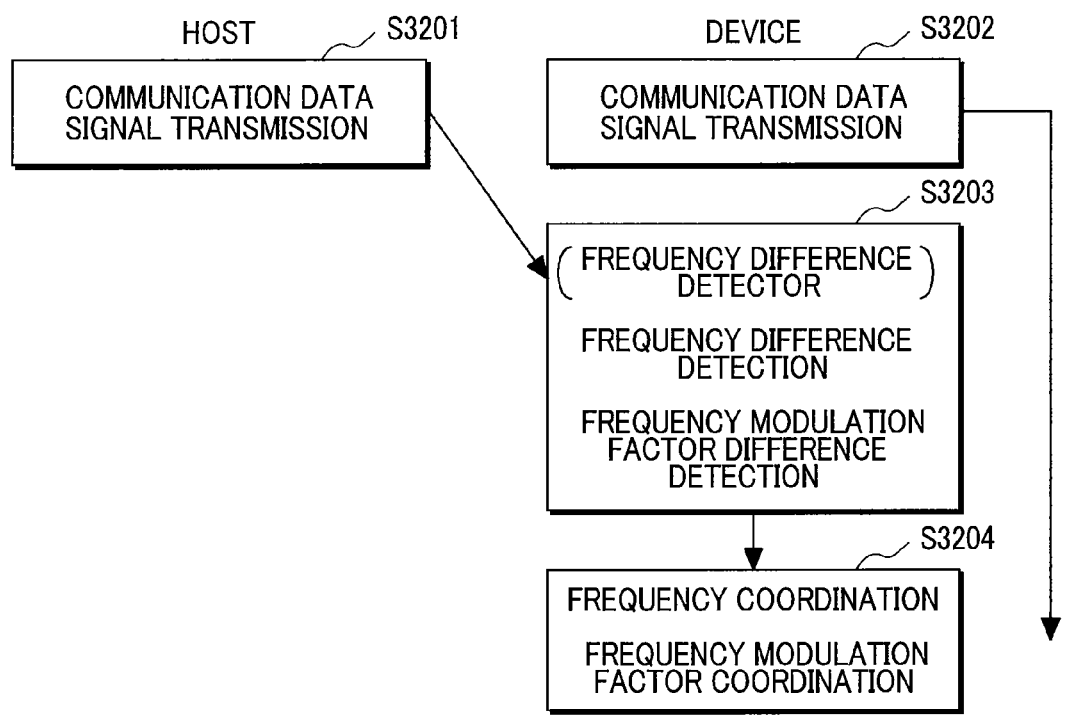
FIG. 34 is a frequency coordination sequence when the communication system in Embodiment 5 in FIG. 25 is in communication establishment status.

FIG. 34 is a flow chart of a frequency coordination sequence according to the present invention, in which communication is being established between transmitting/receiving devices of the communication system, that is, the host 2 and the device 4. This sequence is a frequency coordination sequence, assuming that the communication is already established between the host 2 and the device 4. Namely, a frequency difference between the received signal RS and the transmitting signal TS must fall within an allowable range for establishing the communication. However, due to the deviation of the oscillator 3 related to a change in elapsed time or temperature change, and if this frequency coordination is not performed, the frequency difference between the received signal RS and the transmitting signal TS exceeds the allowable range for establishing communication so that the communication may not be established at all. This is why the frequency coordination is performed frequently while establishing the communication. Moreover, in this embodiment, the communication is established by setting the spread spectrum modulation factor (Xp) of the transmitting signal TS of the device 4 in the power on sequence small with respect to the communication spec. Hence, according to this sequence, after the communication establishment is realized, the spread spectrum modulation factor can be increased while the communication is being established. The coordination of the modulation factor (Xp) during the communication establishment is same as in FIG. 29.

In the initial state, the device 4 transmits communication data as TX to the host 2 (S3202). The host 2 also transmits communication data as RX to the device 4 (S3201).

Meanwhile, having received from the host 2 the communication data as the RX, the device 4 generates and outputs a received signal RS and a synchronization establishment signal SCS. The received signal RS and the transmitting signal TS outputted from the frequency generator 43 are inputted to the frequency difference detector 45, and the frequency difference detector 45 detects the upper limit frequency UF and the lower limit frequency DF of the transmitting signal TS and of the received signal RS and thus, detects a frequency difference and a modulation factor difference (S3203).

Then, the frequency difference detector 45 outputs a frequency coordination signal FCS and a modulation factor coordination signal MCS from the frequency difference and the modulation factor difference, respectively.

Having received the frequency coordination signal FCS and the modulation factor coordination signal MCS, the frequency generator 43 changes the frequency and modulation factor of the transmitting signal Ts, by changing the number of frequency division by the frequency coordination signal FCS and the modulation factor (Xp) by the modulation factor coordination signal MCS, outputs the transmitting signal TS, and performs the frequency coordination in this manner (S3204).

An example of the operation of the transmitting/receiving device with an automatic coordination function of transmission signals according to Embodiment 5 will now be explained by illustrating a power-on sequence regulated under the serial ATA (advanced technology attachment) 1.0a.

The power-on sequence regulated in the serial ATA1.0a is same as the sequence in FIG. 20. A host and a device recognize each other by outputting wake signals (COMRESET, COMINIT, COMWAKE). When both recognize each other, power-on sequence proceeds, and are transited to the status D10.2. The status transition after D10.2 is explained below referring to an enlarged view.

(1) The device is transited to D10.2, and outputs a D10.2 signal to the host;

(2) If the host can recognize the D10.2 signal outputted from the device, it is transited to D10.2 also;

(3) The host outputs a D10.2 signal to the device;

(4) If the device can recognize the D10.2 signal from the host, it is transited to Align and outputs an Align signal to the host;

(5) If the host can recognize the Align signal outputted from the device, it is transited to Align also;

(6) The host outputs an Align signal to the device;

(7) If the device can recognize the Align signal from the host, it is transited to SYNC.

(8) The device outputs a SYNC signal to the host; and (9) If the host can recognize the SYNC signal outputted from the device, it is transited to SYNC.

Here, in the status transition shown in (5), for the host to recognize the Align signal outputted from the device, the Align signal should have a frequency range of 1.5 GHz (±350 ppm) given that it is not performing spread spectrum, while 1.5 GHz (+350 ppm to −5000 ppm) given that it is performing spread spectrum. At this time, the D10.2 signal outputted from the host should have a frequency range of 1.5 GHz (±350 ppm) given that it is not performing spread spectrum, while 1.5 GHz (+350 ppm to −5000 ppm) given that it is performing spread spectrum.

In the transmitting/receiving device with an automatic coordination function of transmission signals according to this embodiment shown in FIG. 25, even though the frequency of the Align signal the device itself outputs in the beginning is in a range that cannot be recognized by the host, if it is not performing spread spectrum using the D10.2 signal outputted from the host, it can coordinate the frequency to 1.5 GHz (±350 ppm), while 1.5 GHz (+350 ppm to −5000 ppm) if it is performing spread spectrum.

Figure 35:
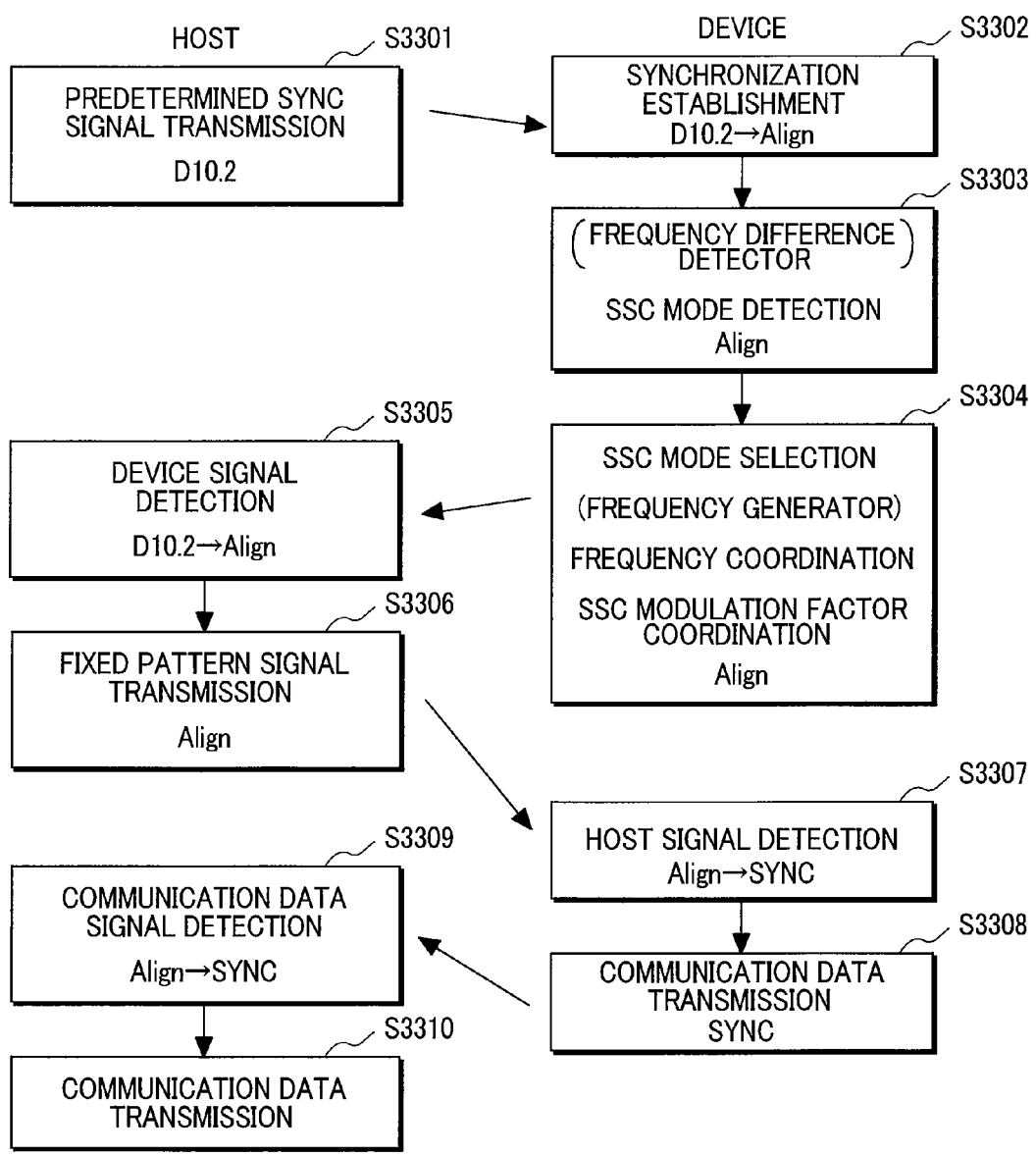
FIG. 35 is a power on sequence of serial ATA 1.0a for explaining the operation in Embodiment 5 shown in FIG. 25.

Referring to FIGS. 20, 35, and 25, the following will now describe the status transition of the host and the device provided that both of them are performing spread spectrum.

FIG. 35 describes a sequence after D10.2 (an enlarged portion in FIG. 20) when the transmitting/receiving device with an automatic coordination function of transmission signals according to this embodiment shown in FIG. 25 operates in power on sequence regulated in the serial ATA (advanced technology attachment) 1.0a.

As shown in FIG. 35, when the host 2 transits to D10.2, it outputs a predetermined sync signal (D10.2 signal) to the device 4 (S3301). Having received the predetermined sync signal (D10.2 signal), the synchronization establishment unit 11 in the device 4 extracts a clock and data from the sync signal (D10.2 signal) and outputs a received signal RS and a synchronization establishment signal SCS, respectively (S3302).

In the frequency difference detector 45, the signal detector 421 which received the synchronization establishment signal (SCS) confirms the predetermined sync signal (D10.2 signal) and when it is recognized, outputs to the sequencer 422 a detection result telling that it could recognize the signal. The sequencer 422 informs the detection results telling that the D10.2 was recognizable, transits the status of the device from D10.2 to Align for its synchronization establishment, and outputs a sequence signal SQS informing the frequency difference detection coordinator 423 of the initiation of frequency difference detection (S3303).

In Align status, a transmitting signal TS of the device must have a frequency in a range of 1.5 GHz (+350 ppm to −5000 ppm). Accordingly, frequency coordination (S3304) is carried out in Align status.

First, an RX signal outputted from the host has a frequency accuracy in the range of 1.5 GHz-1.4925 GHz. Meanwhile, the device in its initial status has Fref=20 MHz, the number of frequency division, N, of the frequency generator 43 is N=80, and the modulation factor is 450 ppm. Here, the frequency generator 43 is a fractional frequency division type PLL which makes the transmitting signal TS perform spread spectrum by changing the number of frequency division N. Now, the upper limit frequency UF and the lower limit frequency DF are UF=1.5 GHz and DF=1.4925 GHz, respectively. Because of this, there is a difference between the upper limit frequency UF and the lower limit frequency DF, and it is detected that the received signal is performing spread spectrum. At this time, the SSC mode decision signal SSD which indicates whether spread spectrum is performed is outputted as high. In addition, the modulation factor coordination signal MCS is set to a value with a sufficient margin with respect to the communication spec, e.g., 3000 ppm (S3303).

Here, the upper limit frequency UF and the lower limit frequency DF of the transmitting signal TS are UF=1.6 GHz and DF=1.5952 GHz. The frequency difference between the upper limit frequency UF of the received signal RS and the upper limit frequency UF of the transmitting signal TS is 0.1

GHz. The difference detector 4533 has a table for example, determines from the table a frequency coordination signal FCS when the frequency difference is 0.1 GHz, and outputs the determined signal. Besides using the table, the difference detector 4533 may apply other diverse methods for determining the frequency coordination signal FCS. Here, it is assumed that −5 is outputted as the frequency coordination signal FCS when a frequency difference is 0.1 GHz. Since the frequency coordination signal FCS is added to the number of frequency division N, the frequency generator 43 takes the number of frequency division N after the addition N=75. A frequency of the transmitting signal TS now falls within a range of 1.5 GHz-1.4955 GHz and thus, the frequency coordination is completed (S3304).

Having received a TX signal, the transmitting signal of the device, the host is capable of recognizing the Align signal of the device at a point when the frequency of the TX signal ranges from 1.5 GHz to 1.4955 GHz (S3305).

If the signal was recognized, the host transits to Align from D10.2 and transmits a fixed pattern signal (Align signal) as an RX signal to the device (S3306).

Having received the fixed pattern signal (Align signal), the synchronization establishment unit 11 in the device 4 extracts a clock and data from the fixed pattern signal (Align signal) and outputs a received signal RS and a synchronization establishment signal SCS, respectively. In the frequency difference detector 45, the signal detector 421 which received the synchronization establishment signal (SCS) confirms the fixed pattern signal (Align signal) and when it is recognized, outputs to the sequencer 422 a detection result telling that it could recognize the signal. The sequencer 422 informs the detection results telling that the fixed pattern signal (Align signal) was recognizable, transits the status of the device from Align to SYNC for its successful synchronization establishment (S3307), and outputs a sequence signal SQS informing the frequency difference detection coordinator 453 of the initiation of frequency difference detection. By the sequence signal SQS, the frequency difference detection coordinator 453 may or may not stop the frequency comparison process between the received signal RS and the transmitting signal TS.

The device 4 being transited to the SYNC status outputs a communication data (SYNC signal) as a TX signal (S3308).

If the host 2 can recognize the communication data (SYNC signal), it transits to SYNC from Align (S3309), and outputs a communication data (SYNC signal) (S3310).

Similar to Embodiment 1, Embodiment 5 does not always require a high-price oscillator, e.g., a crystal oscillator, but a low-price oscillator, e.g., a ceramic oscillator, can be mounted on the board becomes possible, and this leads to cost reduction of the transmitting/receiving device with an automatic coordination function of transmission signals.

In addition, it is possible to provide a low-price semiconductor IC device, in which the output from the frequency generator of the device is not under the influence of noises included in the transmitting/received signal, and which is excellent in adaptability and capable of bidirectional communication facilitating the accommodation to high-speed transmission with a strict noise specification.

Moreover, in Embodiment 5, as in Embodiment 2, the communication between the host and the device is readily adaptive to the spread-spectrum mode. Further, since spread spectrum modulation factor of the device is coordinated, Embodiment 5 can establish a lower price and high-accuracy bidirectional communication compared to Embodiment 2. As a result, it is possible to realize a transmitting/receiving device with an automatic coordination function of transmission signals capable of reducing unnecessary radiation (EMI) generated from the device.

Although the preferred embodiment of the present invention has been described, it will be understood by those skilled in the art that the present invention should not be limited to the described preferred embodiment, but various changes and modifications can be made within the spirit and scope of the present invention as defined by the appended claims.

What is claimed is:

1. A transmitting/receiving device with a transmitting/receiving function performing bidirectional communication with a host, the device comprising:
   a synchronization control unit;
   a frequency generator generating a transmitting signal; and
   a reference signal generation source generating a reference signal,
   wherein the reference signal generation source is formed independently of the host,
   wherein the synchronization control unit detects a frequency difference of the transmitting signal with respect to a received signal from the host, outputs a frequency coordination signal reducing the difference with respect to the received signal and outputs a spread spectrum selection signal,
   wherein the frequency generator determines frequency of the transmitting signal based on the reference signal, controls spread mode of the transmitting signal outputted by the spread spectrum selection signal, and coordinates the frequency of the transmitting signal by the frequency coordination signal,
   wherein the synchronization control unit comprises a synchronization establishment unit, a frequency difference detector, and a frequency generator,
   wherein the synchronization establishment unit converts a signal transmitted from the host to the transmitting/receiving device into data and a clock, and outputs a synchronization establishment signal, the received signal and a reception data,
   wherein the frequency difference detector receives the reference signal, the synchronization establishment signal, the received signal, and a transmitting signal outputted from the frequency generator and is controlled by the synchronization establishment signal,
   wherein the frequency difference detector detects the frequency difference between the received signal and the transmitting signal, and outputs the frequency coordination signal and spread spectrum selection signal,
   wherein the frequency generator receives the reference signal, the frequency coordination signal and the spread spectrum selection signal and controls spread mode and frequency of a transmitting signal outputted based on the frequency coordination signal and the spread spectrum selection signal,
   wherein the frequency difference detector comprises a signal detector, a sequencer, and a frequency difference detection coordinator,
   wherein the signal detector to which the synchronization establishment signal is inputted judges whether synchronization is established and outputs a judgment result to the sequencer,
   wherein the sequencer recognizes a sequence based on the judgment result and outputs a sequence signal to the frequency difference detection coordinator,
   wherein the frequency difference detection coordinator to which the received signal, the transmitting signal, the reference signal and the sequence signal are inputted is controlled of its operation by the sequence signal, detects the frequency difference between the received signal and the transmitting signal at a detection time generated by the reference signal, and outputs the frequency coordination signal and the spread spectrum selection signal, wherein the frequency difference detection coordinator comprises a transmitting frequency detector, a received frequency detector, and a difference detection circuit, wherein the transmitting frequency detector to which the reference signal, the sequence signal and the transmitting signal are inputted is operated under control of the sequence signal, extracts an upper limit frequency, average frequency and lower limit frequency of the transmitting signal by counting a clock of the transmitting signal at a designated time by the reference signal, and outputs the upper limit frequency, the average frequency and the lower limit frequency to the difference detection circuit, wherein the received frequency detector to which the reference signal, the sequence signal and the received signal are inputted is operated under control of the sequence signal, extracts an upper limit frequency, average frequency, lower limit frequency of the transmitting signal and a spread spectrum mode decision signal by counting a clock of the transmitting signal at a designated time by the reference signal, and outputs the upper limit frequency, the average frequency, the lower limit frequency and the spread spectrum mode decision signal to the difference detection circuit, and wherein the difference detection circuit to which the upper limit frequency, average frequency and lower limit frequency of the transmitting signal and the upper limit frequency, average frequency, lower limit frequency, and spread spectrum mode decision signal of the received signal are inputted outputs the frequency coordination signal and the spread spectrum selection signal based on those inputted signals.

2. The transmitting/receiving device according to claim 1, wherein the transmitting frequency detector comprises a counting time generator and a spread spectrum mode detector, wherein the counting time generator to which the reference signal is inputted generates a counting time of the spread spectrum mode detector and outputs the time to the spread spectrum mode detector, and wherein the spread spectrum mode detector to which the transmitting signal, the counting time and the sequence signal are inputted is operated under control of the sequence signal, and generates and extracts the upper limit frequency, the average frequency and the lower limit frequency by counting a clock of the transmitting signal during an interval specified by the counting time.

3. The transmitting/receiving device according to claim 1, wherein the received frequency detector comprises a counting time generator and a spread spectrum mode detector, wherein the counting time generator to which the reference signal is inputted generates a counting time of the spread spectrum mode detector and outputs the time to the spread spectrum mode detector, and wherein the spread spectrum mode detector to which the received signal, the counting time and the sequence signal are inputted is operated under control of the sequence signal, and generates and extracts the upper limit frequency, the average frequency and the lower limit frequency by counting a clock of the received signal during an interval specified by the counting time.

4. A transmitting/receiving device with a transmitting/receiving function performing bidirectional communication with a host, the device comprising:

a synchronization control unit;

a frequency generator generating a transmitting signal; and a reference signal generation source generating a reference signal, wherein the synchronization control unit detects a frequency difference of the transmitting signal with respect to a received signal from the host and outputs a frequency coordination signal reducing the difference with respect to the received signal;

wherein the frequency generator determines the frequency of the transmitting signal based on the reference signal and coordinates the frequency of the transmitting signal by the frequency coordination signal, wherein the reference signal generation source is formed independently of the host, wherein the synchronization control unit detects the frequency difference of the transmitting signal with respect to a received signal from the host, outputs a frequency coordination signal reducing the difference with respect to the received signal, and outputs a spread spectrum selection signal, and detects a frequency modulation factor of the transmitting signal with respect to the received signal and outputs the frequency modulation factor coordination signal reducing the difference with respect to the received signal, wherein the frequency generator determines frequency of the transmitting signal based on the reference controls spread mode of the transmitting signal outputted by the spread spectrum selection signal, coordinates the frequency of the transmitting signal by the frequency coordination signal, and coordinates the frequency modulation factor of the transmitting signal by the frequency modulation factor coordination signal, wherein a synchronization establishment unit of the synchronization control unit converts a signal transmitted from the host to the transmitting/receiving device into data and a clock, and outputs them as a synchronization establishment signal, the received signal and a reception data, wherein a frequency difference detector of the synchronization control unit, to which the reference signal, the synchronization establishment signal, the received signal, and a transmitting signal outputted from the frequency generator are inputted, is controlled by the synchronization establishment signal, detects the frequency difference and a frequency modulation factor difference between the received signal and the transmitting signal, and outputs a frequency coordination signal, a spread spectrum selection signal, and a frequency modulation factor coordination signal, and wherein a frequency generator of the synchronization control unit, to which the reference signal, the frequency coordination signal, the spread spectrum selection signal, and the frequency modulation factor coordination signal are inputted, controls spread mode and frequency of a transmitting signal outputted by the frequency coordination signal, the spread spectrum selection signal and the frequency modulation factor coordination signal.

5. The transmitting/receiving device according to claim 4, wherein the frequency difference detector comprises a signal detector, a sequencer, and a frequency difference detection coordinator, wherein the signal detector to which the synchronization establishment signal is inputted judges whether synchronization is established and outputs a judgment result to the sequencer, wherein the sequencer recognizes a sequence based on the judgment result and outputs a sequence signal to the frequency difference detection coordinator, wherein the frequency difference detection coordinator to which the received signal, the transmitting signal, the reference signal and the sequence signal are inputted is controlled of its operation by the sequence signal, detects the frequency difference between the received signal and the transmitting signal at a detection time generated by the reference signal, and outputs the frequency coordination signal, the spread spectrum selection signal, and the frequency modulation factor coordination signal.

6. The transmitting/receiving device according to claim 5, wherein the frequency difference detection coordinator comprises a transmitting frequency detector, a received frequency detector, and a difference detection circuit, wherein the transmitting frequency detector to which the reference signal, the sequence signal and the transmitting signal are inputted is operated under control of the sequence signal, extracts an upper limit frequency and lower limit frequency of the transmitting signal by counting a clock of the transmitting signal at a designated time by the reference signal, and outputs the upper limit frequency and the lower limit frequency to the difference detection circuit, and wherein the received frequency detector to which the reference signal, the sequence signal, and the received signal are inputted is operated under control of the sequence signal, extracts an upper limit frequency, lower limit frequency of the transmitting signal and a spread spectrum mode decision signal by counting a clock of the transmitting signal at a designated time by the reference signal, and outputs the upper limit frequency, the lower limit frequency and the spread spectrum mode decision signal to the difference detection circuit, and wherein the difference detection circuit to which the upper limit frequency and lower limit frequency of the transmitting signal and the upper limit frequency and lower limit frequency of the received signal and spread spectrum mode decision signal are inputted outputs the frequency coordination signal, the spread spectrum selection signal, and the frequency modulation factor coordination signal based on those inputted signals.

7. The of the received signal according to claim 6, wherein the transmitting frequency detector comprises a counting time generator and a spread spectrum mode detector, wherein the counting time generator to which the reference signal is inputted generates a counting time of the spread spectrum mode detector and outputs the time to the spread spectrum mode detector, and wherein the spread spectrum mode detector to which the transmitting signal, the counting time and the sequence signal are inputted is operated under control of the sequence signal, and generates and extracts the upper limit frequency, the average frequency and the lower limit frequency by counting a clock of the transmitting signal during an interval specified by the counting time.

8. The of the received signal according to claim 6, wherein the received frequency detector comprises a counting time generator and a spread spectrum mode detector, wherein the counting time generator to which the reference signal is inputted generates a counting time of the spread spectrum mode detector and outputs the time to the spread spectrum mode detector, and wherein the spread spectrum mode detector to which the received signal, the counting time and the sequence signal are inputted is operated under control of the sequence signal, and generates and extracts the upper limit frequency, the average frequency and the lower limit frequency by counting a clock of the received signal during an interval specified by the counting time.

* * * * *